(12) United States Patent
Chang et al.

(10) Patent No.: US 9,006,810 B2
(45) Date of Patent: Apr. 14, 2015

(54) DRAM WITH A NANOWIRE ACCESS TRANSISTOR

(75) Inventors: Josephine B. Chang, Mahopac, NY (US); Jeffrey W. Sleight, Ridgefield, CT (US)

(73) Assignee: International Business Machines Corporation, Armonk, NY (US)

( * ) Notice: Subject to any disclaimer, the term of this patent is extended or adjusted under 35 U.S.C. 154(b) by 20 days.

(21) Appl. No.: 13/490,759

(22) Filed: Jun. 7, 2012

(65) Prior Publication Data
US 2013/0328116 A1  Dec. 12, 2013

(51) Int. Cl.
| | |
|---|---|
| H01L 27/108 | (2006.01) |
| H01L 29/94 | (2006.01) |
| B82Y 10/00 | (2011.01) |
| H01L 21/84 | (2006.01) |
| H01L 27/12 | (2006.01) |
| H01L 29/06 | (2006.01) |
| H01L 29/66 | (2006.01) |
| H01L 29/775 | (2006.01) |

(Continued)

(52) U.S. Cl.
CPC .......... *H01L 27/10805* (2013.01); *B82Y 10/00* (2013.01); *H01L 21/84* (2013.01); *H01L 27/0207* (2013.01); *H01L 27/10873* (2013.01); *H01L 27/1203* (2013.01); *H01L 29/0673* (2013.01); *H01L 29/66439* (2013.01); *H01L 29/775* (2013.01); *H01L 29/945* (2013.01); *Y10S 977/89* (2013.01); *Y10S 977/943* (2013.01)

(58) Field of Classification Search
USPC ......................................................... 438/211
See application file for complete search history.

(56) References Cited

U.S. PATENT DOCUMENTS

| | | |
|---|---|---|
| 7,170,084 B1 * | 1/2007 | Xiang et al. .................... 257/19 |
| 8,008,146 B2 | 8/2011 | Bangsaruntip et al. |
| 2002/0093053 A1 | 7/2002 | Chan et al. |

(Continued)

FOREIGN PATENT DOCUMENTS

KR  20060128620  12/2006

OTHER PUBLICATIONS

Bangsaruntip, S., et al., "High Performance and Highly Uniform Gate-All-Around Silicon Nanowire MOSFETs with Wire Size Dependent Scaling", Electron Devices Meeting (IEDM), 2009 IEEE International Issue Date: Dec. 7-9, 2009 on pp. 1-4.

(Continued)

*Primary Examiner* — Mamadou Diallo
*Assistant Examiner* — Jay C Chang
(74) *Attorney, Agent, or Firm* — Scully, Scott, Murphy & Presser, P.C.; H. Daniel Sehnurmann

(57) ABSTRACT

A semiconductor nanowire is formed integrally with a wraparound semiconductor portion that contacts sidewalls of a conductive cap structure located at an upper portion of a deep trench and contacting an inner electrode of a deep trench capacitor. The semiconductor nanowire is suspended from above a buried insulator layer. A gate dielectric layer is formed on the surfaces of the patterned semiconductor material structure including the semiconductor nanowire and the wraparound semiconductor portion. A wraparound gate electrode portion is formed around a center portion of the semiconductor nanowire and gate spacers are formed. Physically exposed portions of the patterned semiconductor material structure are removed, and selective epitaxy and metallization are performed to connect a source-side end of the semiconductor nanowire to the conductive cap structure.

18 Claims, 28 Drawing Sheets

(51) Int. Cl.
*H01L 21/8238* (2006.01)
*H01L 27/02* (2006.01)

(56) References Cited

U.S. PATENT DOCUMENTS

| | | | |
|---|---|---|---|
| 2006/0071260 A1 | 4/2006 | Yamasaki | |
| 2009/0173980 A1 | 7/2009 | Cheng et al. | |
| 2009/0176347 A1* | 7/2009 | Cheng et al. | 438/388 |
| 2009/0184392 A1 | 7/2009 | Cheng et al. | |
| 2009/0256185 A1* | 10/2009 | Cheng et al. | 257/301 |
| 2010/0193770 A1 | 8/2010 | Bangsaruntip et al. | |
| 2011/0133167 A1 | 6/2011 | Bangsaruntip et al. | |
| 2011/0272673 A1* | 11/2011 | Bangsaruntip et al. | 257/24 |
| 2011/0291190 A1* | 12/2011 | Xiao et al. | 257/347 |
| 2012/0025288 A1 | 2/2012 | Doris et al. | |

OTHER PUBLICATIONS

Office Action dated May 24, 2013 received in a related U.S. Appl. No. 13/774,682.

Notice of Allowance dated Oct. 23, 2013 received in a related U.S. Appl. No. 13/774,682.

International Search Report/Written Opinion; PCT/US2013/041038; Aug. 27, 2013.

* cited by examiner

DRAM WITH A NANOWIRE ACCESS TRANSISTOR

BACKGROUND

The present disclosure relates to a semiconductor structure, and particularly to a dynamic random access memory (DRAM) cell including a nanowire access transistor and a method of manufacturing the same.

Deep trench capacitors are used in a variety of semiconductor chips for high area capacitance and low device leakage. Typically, a deep trench capacitor provides a capacitance in the range from 4 fF (femto-Farad) to 120 fF. A deep trench capacitor may be employed as a charge storage unit in a dynamic random access memory (DRAM), which may be provided as a stand-alone semiconductor chip, or may be embedded in a system-on-chip (SoC) semiconductor chip. A deep trench capacitor may also be employed in a variety of circuit applications such as a charge pump or a capacitive analog component in a radio-frequency (RF) circuit.

As dimensions of semiconductor devices scale, semiconductor nanowire transistors with a wraparound gate structure are employed to provide enhanced gate control and lower leakage current over conventional field effect transistors. However, the integration of such semiconductor nanowire transistors with deep trench capacitors remains a challenge because a semiconductor nanowire inherently limits a contact area with any other structure because of the small lateral dimension of the semiconductor nanowire.

BRIEF SUMMARY

A semiconductor nanowire is formed integrally with a wraparound semiconductor portion that contacts sidewalls of a conductive cap structure located at an upper portion of a deep trench and contacting an inner electrode of a deep trench capacitor. The semiconductor nanowire is suspended from above a buried insulator layer. A gate dielectric layer is formed on the surfaces of the patterned semiconductor material structure including the semiconductor nanowire and the wraparound semiconductor portion. A wraparound gate electrode portion is formed around a center portion of the semiconductor nanowire and gate spacers are formed. Physically exposed portions of the patterned semiconductor material structure are removed, and selective epitaxy and metallization are performed to connect a source-side end of the semiconductor nanowire to the conductive cap structure.

According to an aspect of the present disclosure, a semiconductor structure includes a trench capacitor embedded in a substrate. The trench capacitor includes an inner electrode, a node dielectric, and an outer electrode. The semiconductor structure further includes a conductive strap structure in contact with, and overlying, the inner electrode. Further, the semiconductor structure includes a semiconductor nanowire overlying an insulator layer in the substrate. A source region contacts one end of the semiconductor nanowire. A source-side metal semiconductor alloy portion contacts the source region and the conductive strap structure.

According to another aspect of the present disclosure, a method of forming a semiconductor structure is provided. A trench capacitor including an inner electrode, a node dielectric, and an outer electrode is formed in a semiconductor-on-insulator substrate including a handle substrate, a buried insulator layer, and a top semiconductor layer. A conductive cap structure is formed over the inner electrode. A patterned semiconductor material structure is formed, which includes a semiconductor nanowire and a wraparound semiconductor portion that laterally contacts the conductive cap structure from a portion of the top semiconductor layer. A portion of the semiconductor nanowire that adjoins the wraparound semiconductor portion is formed. An end surface of the semiconductor nanowire is physically exposed. An electrically conductive path is formed between the physically exposed end surface and the conductive cap structure by depositing at least one conductive material.

DETAILED DESCRIPTION

Figure 1A:
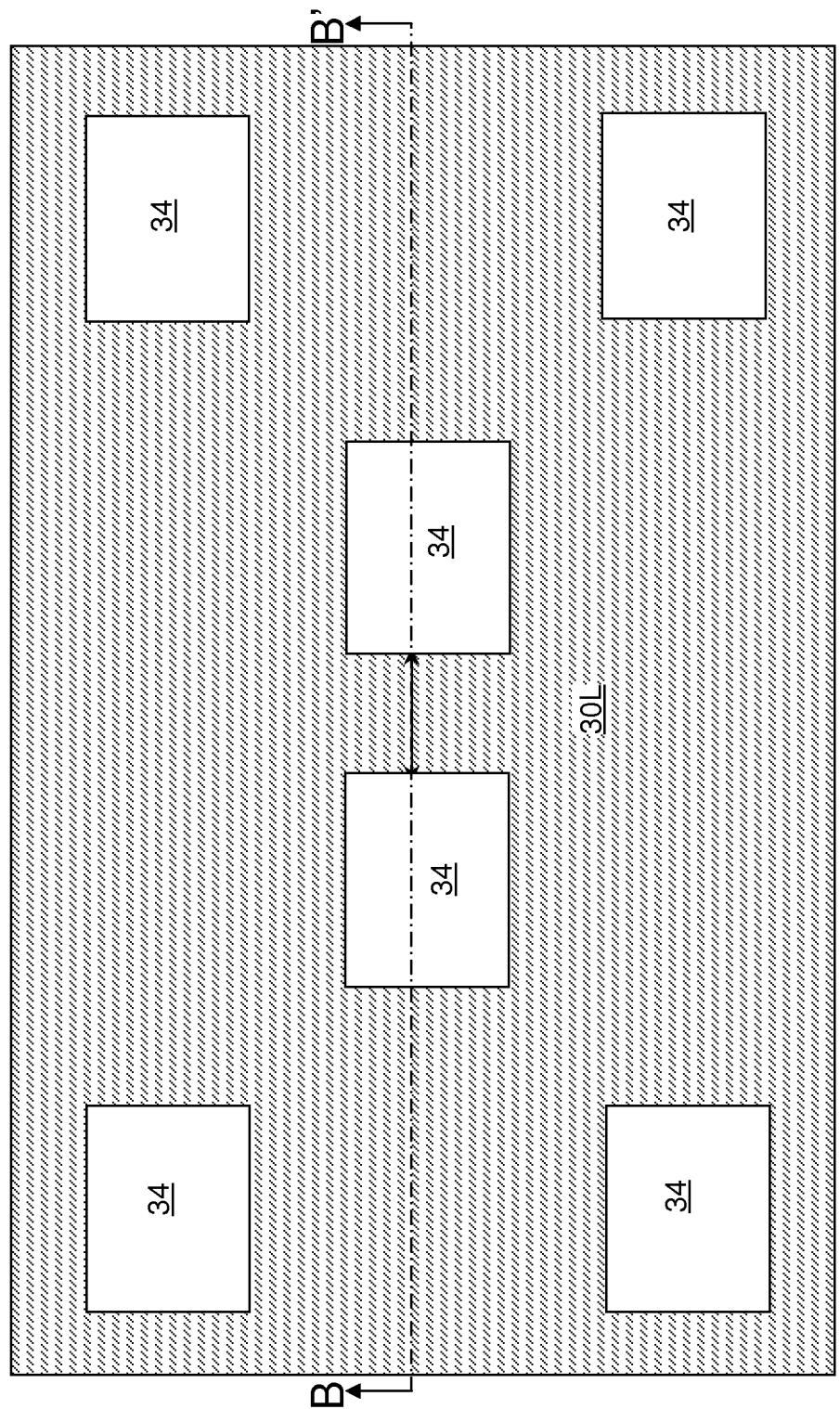
FIG. 1A is a top-down view of an exemplary semiconductor structure after formation of deep trench capacitors, conductive cap structures, and dielectric cap structures in a semiconductor-on-insulator (SOI) substrate according to an embodiment of the present disclosure.

As stated above, the present disclosure relates to a semiconductor structure including a dynamic random access memory (DRAM) cell including a nanowire access transistor and a method of manufacturing the same. These aspects of the present disclosure are now described in detail with accompanying figures. It is noted that like reference numerals refer to like elements across different embodiments. The drawings are not necessarily drawn to scale.

Figure 1B:
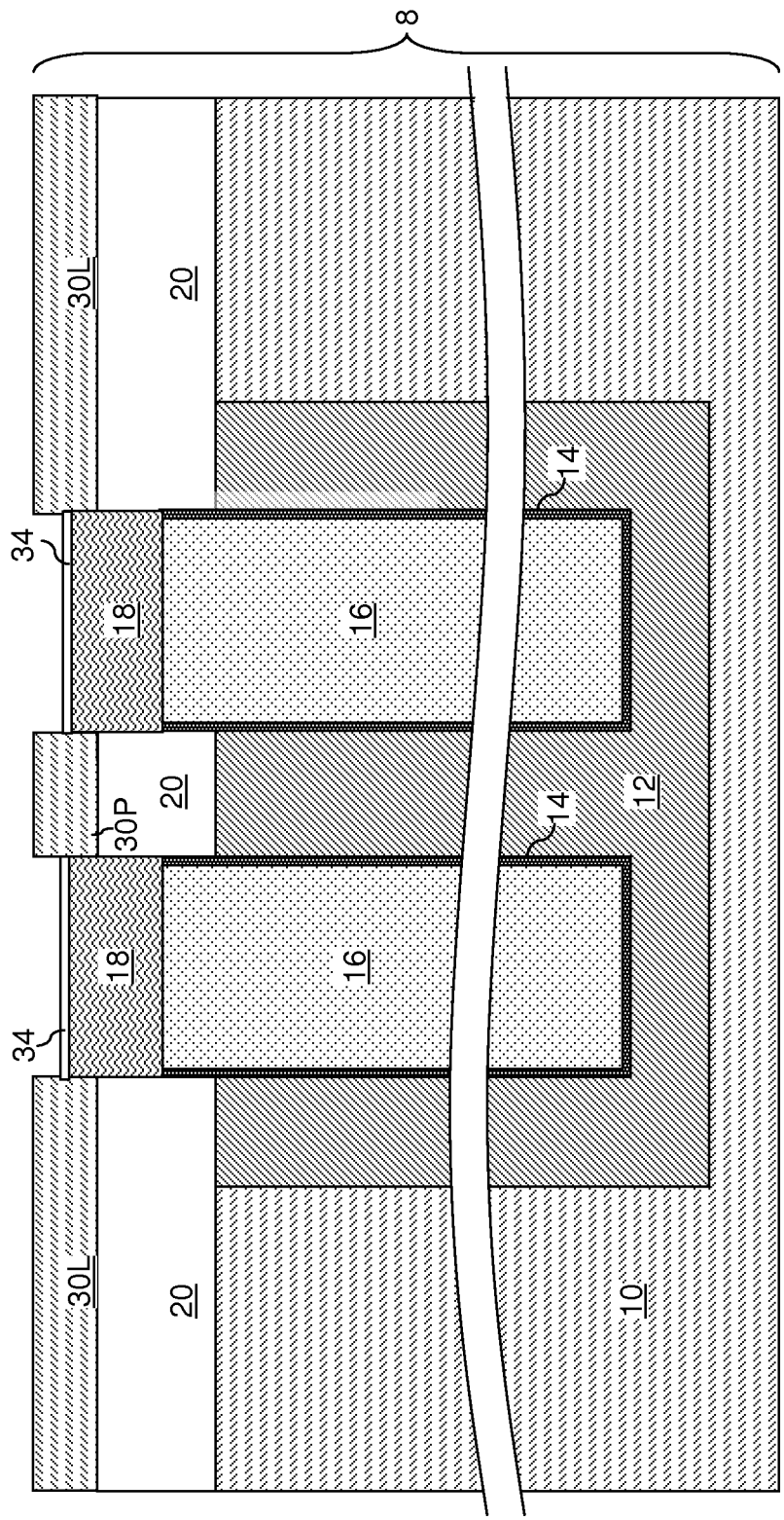
FIG. 1B is a vertical cross-sectional view of the exemplary semiconductor structure along the vertical plane B-B' of FIG. 1A.

Referring to FIGS. 1A and 1B, an exemplary semiconductor structure according to an embodiment of the present disclosure includes a semiconductor-on-insulator (SOI) substrate 8. The SOI substrate includes a stack, from bottom to top, of a bottom semiconductor layer 10, a buried insulator layer 20, and a top semiconductor layer 30L, which can be initially provided as a planar layer having a same thickness throughout over the buried insulator layer.

The bottom semiconductor layer 10 includes a semiconductor material. The buried insulator layer 20 includes a dielectric material such as silicon oxide, silicon nitride, a dielectric metal oxide, or a combination thereof. The top semiconductor layer 30L includes a semiconductor material, which can be the same as, or different from, the semiconductor material of the bottom semiconductor layer 10.

Each of the bottom semiconductor layer 10 and the top semiconductor layer 30L includes a semiconductor material independently selected from elemental semiconductor materials (e.g., silicon, germanium, carbon, or alloys thereof), III-V semiconductor materials, or II-VI semiconductor materials. Each semiconductor material for the bottom semiconductor layer 10 and the top semiconductor layer 30L can be independently single crystalline, polycrystalline, or amorphous. In one embodiment, the bottom semiconductor layer 10 and the top semiconductor layer 30L are single crystalline. In one embodiment, the bottom semiconductor layer 10 and the top semiconductor layer 30L include single crystalline silicon.

In one embodiment, the bottom semiconductor layer 10 can be doped with dopants of a first conductivity type. The first conductivity type can be p-type or n-type.

In one embodiment, the thickness of the top semiconductor layer 30L can be from 5 nm to 300 nm, the thickness of the buried insulator layer 20 can be from 50 nm to 1,000 nm, and the thickness of the bottom semiconductor layer 10 can be from 50 microns to 2 mm, although lesser and greater thicknesses can also be employed for each of these layers.

At least one pad layer (not shown) can be deposited on the SOI substrate 8, for example, by chemical vapor deposition (CVD) or atomic layer deposition (ALD). The at least one pad layer can include one or more layers that can be employed as an etch mask for forming a deep trench in the SOI substrate 8. As used herein, a "deep trench" refers to a trench that extends from a topmost surface of a semiconductor-on-insulator (SOI) substrate through a top semiconductor layer and a buried insulator layer and partly into an underlying semiconductor layer, i.e., the bottom semiconductor layer 10.

In one embodiment, each of the at least one pad layer can include a dielectric material such as silicon nitride, a dielectric metal nitride, a doped silicon undoped silicon oxide, or a dielectric metal oxide. The total thickness of the at least one pad layer can be from 100 nm to 2,000 nm, although lesser and greater thicknesses can also be employed.

In one embodiment, the at least one pad layer can include a stack of a lower pad layer (not shown) and an upper pad layer (not shown). The lower pad layer can include a first dielectric material, and the upper pad layer can include a second dielectric material that is different from the first dielectric material. In one embodiment, the lower pad layer can include silicon oxide, and the upper pad layer can include silicon nitride. In one embodiment, the thickness of the lower pad layer can be from 10 nm to 100 nm, and the thickness of the upper pad layer can be from 40 nm to 360 nm, although lesser and greater thicknesses can also be employed for each of the lower pad layer and the upper pad layer.

A photoresist layer (not shown) can be applied over the at least one pad layer and can be lithographically patterned to form openings each having an area of a deep trench to be subsequently formed. The pattern in the photoresist layer can be transferred into the at least one pad layer. Subsequently, the pattern in the at least one pad layer can be transferred through the top semiconductor layer 30L, the buried insulator layer 20, and an upper portion of the bottom semiconductor layer 10 by an anisotropic etch that employs the at least one pad layer as an etch mask. Deep trenches can be formed for each opening in the at least one pad layer. The photoresist can be removed by ashing, or can be consumed during the etch process that forms the deep trench.

The sidewalls of the deep trench can be substantially vertically coincident among the various layers through which the deep trench extends. As used herein, sidewalls of multiple elements are "vertically coincident" if the sidewalls of the multiple elements overlap in a top-down view such as FIG. 1A. As used herein, sidewalls of multiple elements are "substantially vertically coincident" if the lateral offset of the sidewalls of the multiple elements from a perfectly vertical surface is within 5 nm. The depth of the deep trenches as measured from the plane of the topmost surface of the SOI substrate 8 to the bottom surface of the deep trenches can be from 500 nm to 10 microns, although lesser and greater depths can also be employed. The lateral dimensions of each deep trench can be limited by the lithographic capabilities, i.e., the ability of a lithographic tool to print the image of an opening on the photoresist layer. In one embodiment, the "width," i.e., a sidewall to sidewall distance, of the deep trench along the direction parallel to the B-B' plane and along the direction perpendicular to the B-B' plane can be from 32 nm to 150 nm, although lesser dimensions can be employed with availability of lithographic tools capable of printing smaller dimensions in the future.

A buried plate 12 can be formed by doping a portion of the bottom semiconductor layer 12 in proximity of sidewalls of the bottom semiconductor layer 10 within each deep trench. Dopants can be introduced, for example, by outdiffusion from a dopant-including disposable material (such as a doped silicate glass) or by ion implantation as known in the art. Further, any other method of forming a buried plate 12 in the bottom semiconductor layer 10 of an SOI substrate 8 can be employed in lieu of outdiffusion from a dopant-including disposable material or ion implantation.

In one embodiment, the buried plate 12 can be doped with dopants of a second conductivity type which is the opposite of the first conductivity type. For example, the first conductivity type can be p-type and the second conductivity type can be n-type, or vice versa. A p-n junction is formed between the remaining portion of the bottom semiconductor layer 10 and the buried plate 12. The dopant concentration in the buried plate 12 can be, for example, from $1.0 \times 10^{18}/cm^3$ to $2.0 \times 10^{21}/cm^3$, and typically from $5.0 \times 10^{18}/cm^3$ to $5.0 \times 10^{19}/cm^3$, although lesser and greater dopant concentrations can also be employed.

A dielectric material for node dielectrics 14 can be deposited conformally on all physically exposed sidewalls in the deep trenches and on the top surface of the upper pad layer. The dielectric material for the node dielectrics 14 can include any dielectric material that can be employed as a node dielectric material in a capacitor known in the art. For example, the dielectric material for the node dielectrics 14 can include at least one of silicon nitride and a dielectric metal oxide material such as high dielectric constant (high-k) gate dielectric material as known in the art.

A conductive material for inner electrodes 16 can be deposited to completely fill the deep trenches. The conductive material can be a metallic material or a doped semiconductor material. The metallic material can be an elemental metal such as W, Ti, Ta, Cu, or Al, or an ally of at least two elemental metals, or a conductive metallic nitride of at least one metal, or a conductive metallic oxide of at least one metal. The doped semiconductor material can be a doped elemental semiconductor material, a doped compound semiconductor material, or an alloy thereof. The inner electrode 16 can be deposited by physical vapor deposition (PVD), chemical vapor deposition (CVD), electroplating, electroless plating, or a combination thereof. The material for the inner electrode 16 is deposited to a thickness that is sufficient to completely fill the deep trenches.

The material for the inner electrode 16 can be vertically recessed to a level between the top surface of the buried insulator layer 20 and the bottom surface of the buried insulator layer 20 by a recess etch. The recess etch of the conductive material layer can employ an anisotropic etch such as a reactive ion etch, an isotropic etch such as a wet etch, or a combination thereof. The recess etch can be selective to the material of the node dielectric 14.

Upon recess, the topmost surface of each inner electrode 16 can be substantially planar, and can be located between the level of the top surface of the buried insulator layer 20 and the level of the bottom surface of the buried insulator layer 20. A surface is substantially planar if the planarity of the surface is limited by microscopic variations in surface height that accompanies semiconductor processing steps known in the art. A cavity is present above the inner electrode 16 at this time.

The physically exposed portions of the node dielectric 14 can be patterned by an etch, which can be a wet etch. For example, if the node dielectric 14 includes silicon nitride, the physically exposed portions of the node dielectric 14 can be removed by a wet etch employing hot phosphoric acid. The set of the buried plate 12, the node dielectric 14, and the inner electrode 16 constitutes a trench capacitor (12, 14, 16). The buried plate 12 is an outer node of the trench capacitor, the node dielectric 14 is the dielectric separating the outer electrode from the inner electrode, and the inner electrode 16 is the inner electrode of the trench capacitor. The trench capacitor is embedded within the SOI substrate 8. The buried insulator layer 20 overlies the buried plate 12 (i.e., the outer electrode).

A conductive strap structure 18 can be formed with each deep trench, for example, by depositing a conductive material within the cavity above each inner electrode 16 and above the at least one pad layer, and subsequently recessing the conductive material from above the at least one pad layer and optionally recessing the conductive material at an upper portion of each deep trench. Specifically, the conductive material can be a metallic material or a doped semiconductor material. The metallic material can be an elemental metal such as W, Ti, Ta, Cu, or Al, or an alloy of at least two elemental metals, or a conductive metallic nitride of at least one metal, or a conductive metallic oxide of at least one metal. The doped semiconductor material can be a doped elemental semiconductor material, a doped compound semiconductor material, or an alloy thereof. The conductive material can be deposited by physical vapor deposition (PVD), chemical vapor deposition (CVD), electroplating, electroless plating, or a combination thereof. The conductive material is deposited to a thickness that is sufficient to completely fill the cavity.

The conductive material can be planarized, for example, by chemical mechanical planarization (CMP) employing the upper pad layer as a stopping layer. Subsequently, the conductive material is recessed below the topmost surface of the top semiconductor layer 30L to form the conductive strap structures 18. In one embodiment, the top surface of the conductive strap structure 18 can be located at or above the top surface of the top semiconductor layer 30L. The conductive strap structure 18 can include the same material as, or a material different from, the inner electrode 16. A cavity is formed above the conductive strap structure 18. The conductive strap structure 18 is in contact with, and overlies, the inner electrode 16.

A dielectric material for dielectric cap structures 34 can be deposited within each cavity above the conductive strap structures 18 and above the at least one pad layer. The dielectric material for dielectric cap structures 34 can be subsequently planarized employing the upper pad layer as a stopping layer, and then recessed below the topmost surface of the upper pad layer to form dielectric cap structures 34. In one embodiment, the top surfaces of the dielectric cap structures 34 can be substantially coplanar with, or can be located below, the top surface of the top semiconductor layer 30L. The dielectric material of the dielectric cap structures 34 can be, for example, silicon nitride or a dielectric metal oxide material. In one embodiment, the dielectic material of the dielectric cap structures 34 can be selected to be etch resistant to an isotropic etch to be subsequently used to suspend nanowires. The dielectric material of the dielectric cap structures 34 can be deposited, for example, by chemical vapor deposition (CVD).

The dielectric cap structures 34 contacts the top surfaces of the conductive strap structures 18. Specifically, the bottom surface of each dielectric cap structures 34 can be planar, and coincides with the top surface of a conductive strap structure 18 directly underneath.

The upper pad layer can be removed, for example, by a wet etch selective to the lower pad layer. The lower pad layer can be subsequently removed, for example, by another wet etch.

Figure 2A:
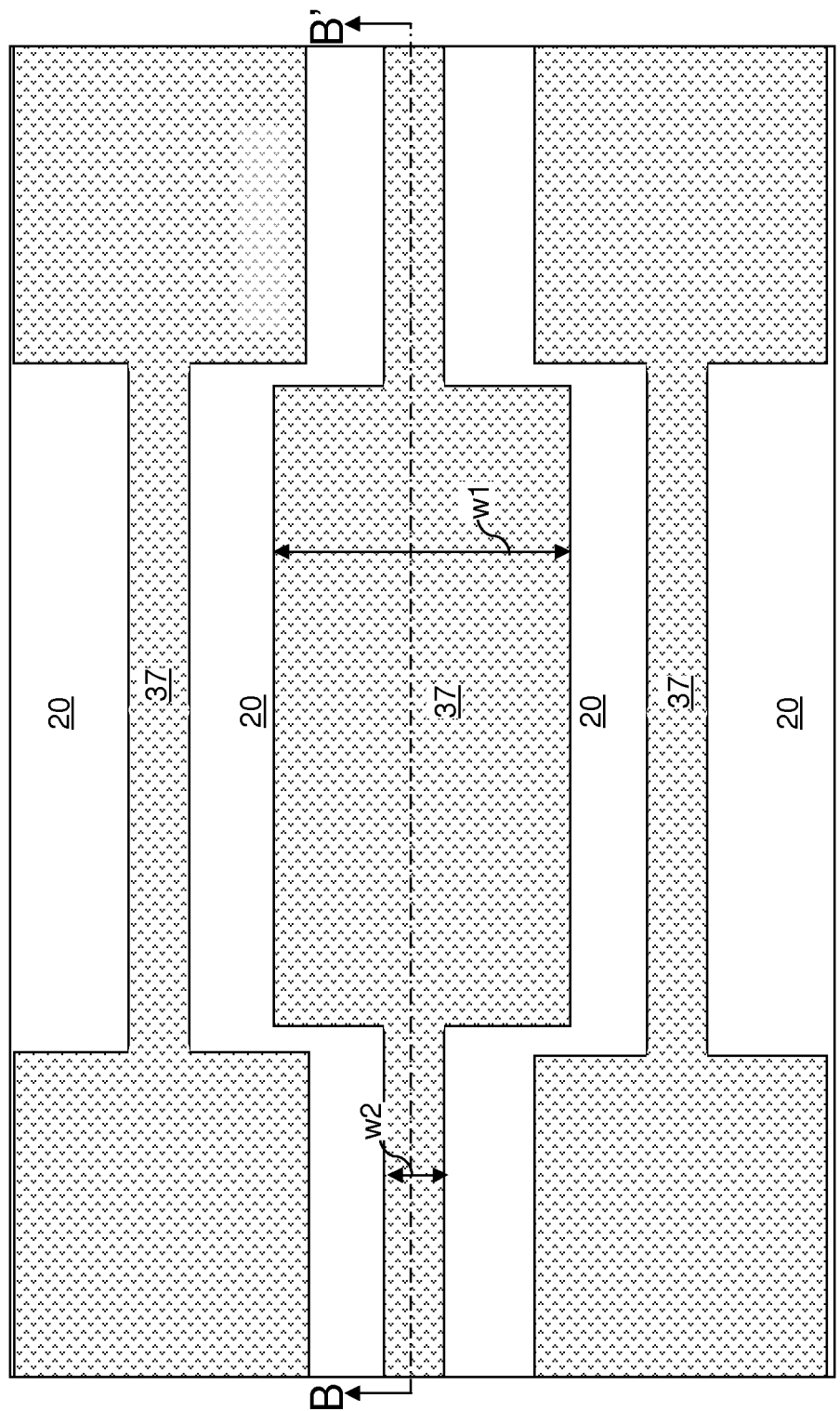
FIG. 2A is a top-down view of the exemplary semiconductor structure after lithographic patterning of a top semiconductor layer into patterned semiconductor material structures according to an embodiment of the present disclosure.
Figure 2B:
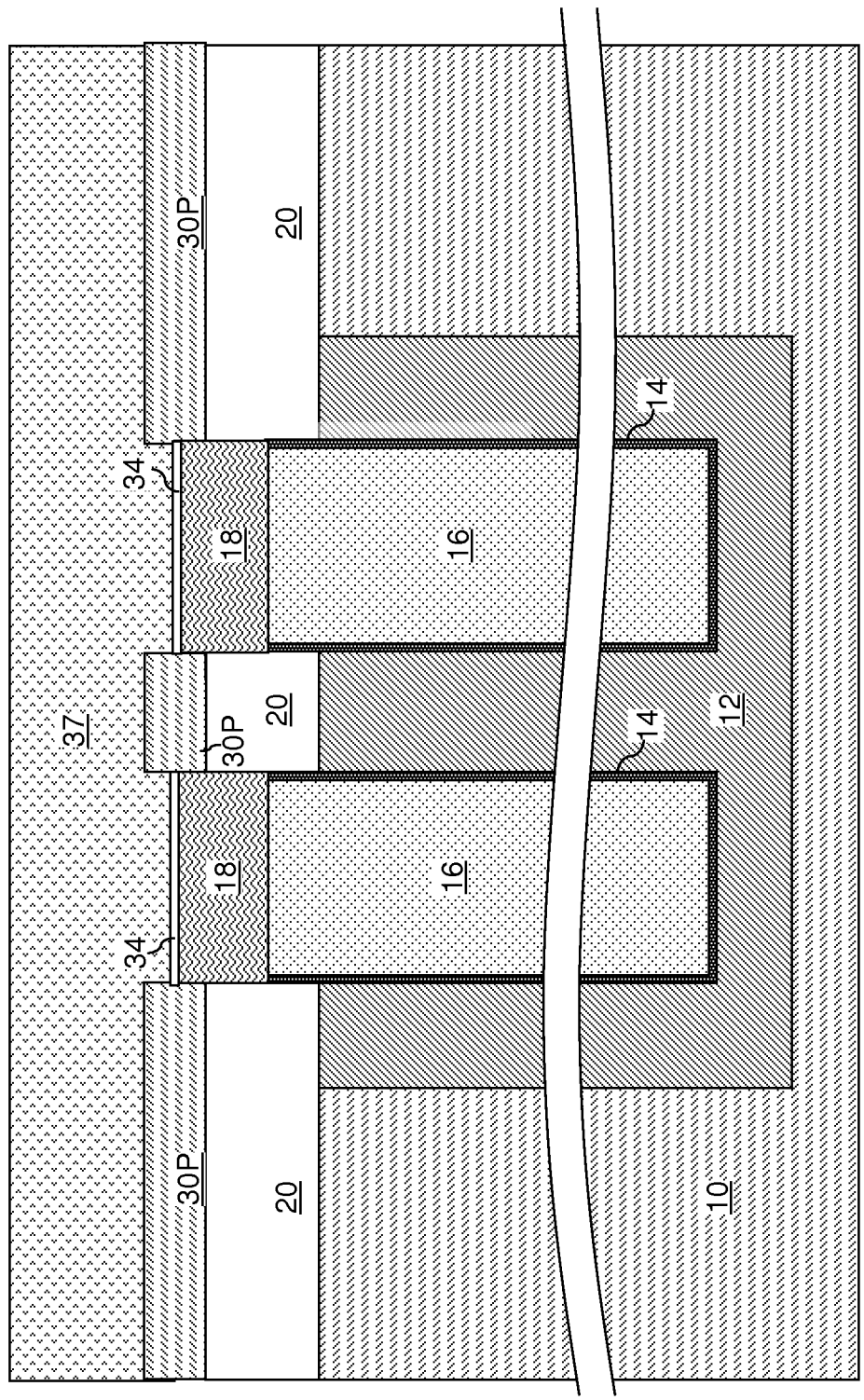
FIG. 2B is a vertical cross-sectional view of the exemplary semiconductor structure along the vertical plane B-B' of FIG. 2A.

Referring to FIGS. 2A and 2B, a photoresist layer 37 can be applied over the top semiconductor layer 30L. The photoresist layer 37 can be lithographically patterned to form a plurality of photoresist portions, each of which includes an alternating sequence of a first width region having a first width w1 and a second width region having a second width w2 that is less than the first width w1. Each of the first width w1 and the second width w2 is a lithographic width, i.e., a width that can be printed employing a single lithographic exposure step and a subsequently development.

Each contiguous portion of the photoresist layer 37 can extend along a direction perpendicular to the direction of the first width w1 and the second width. The pattern within each contiguous portion of the photoresist layer 37 can be periodic along the horizontal direction perpendicular to the first width w1 and the second width, e.g., along the horizontal direction within the plane B-B'. The periodicity of the pattern within each contiguous portion of the photoresist layer 37 can be the sum of the length of the first width region and the length of the second width region, which coincides with the lateral dimension of the region illustrated in FIG. 2A. The lithographic pattern of each contiguous portion of the photoresist layer 37 can be repeated along the direction of the first width w1 and the second width w2 with an offset along the horizontal direction that is perpendicular to the first width w1 and the second width w2. The offset can be one half of the periodicity of a contiguous portion of the photoresist layer 37, i.e., one half of the sum of the length of the first width region and the length of the second width region.

The first width w1 is selected to be greater than dimension of the deep trenches along the direction of the first width w1. In one embodiment, each first width region can contiguously cover each adjacent pair of deep trenches. Further, each first width region can cover areas that laterally surround a pair of adjacent deep trenches. The second width w2 can be a lithographic minimum dimension, i.e., a smallest dimension that can be lithographically printed. For example, the second width w2 can be from 45 nm to 150 nm, depending on the capabilities of lithographic tools employed to pattern the photoresist layer 37.

The pattern in the photoresist layer 37 is transferred into the top semiconductor layer 30L by an etch, which can be an anisotropic etch. Portions of the top semiconductor layer 30L that are not covered by the photoresist layer 37 are removed during the etch. Patterned semiconductor material portions 30P are formed underneath each remaining portion of the photoresist layer 37. Each patterned semiconductor material portion 30P replicates the pattern in the overlying portion of the photoresist layer 37. For example, each patterned semiconductor material portion 30P can include a first portion having the first width w1 and a second portion having the second width w2.

Figure 3A:
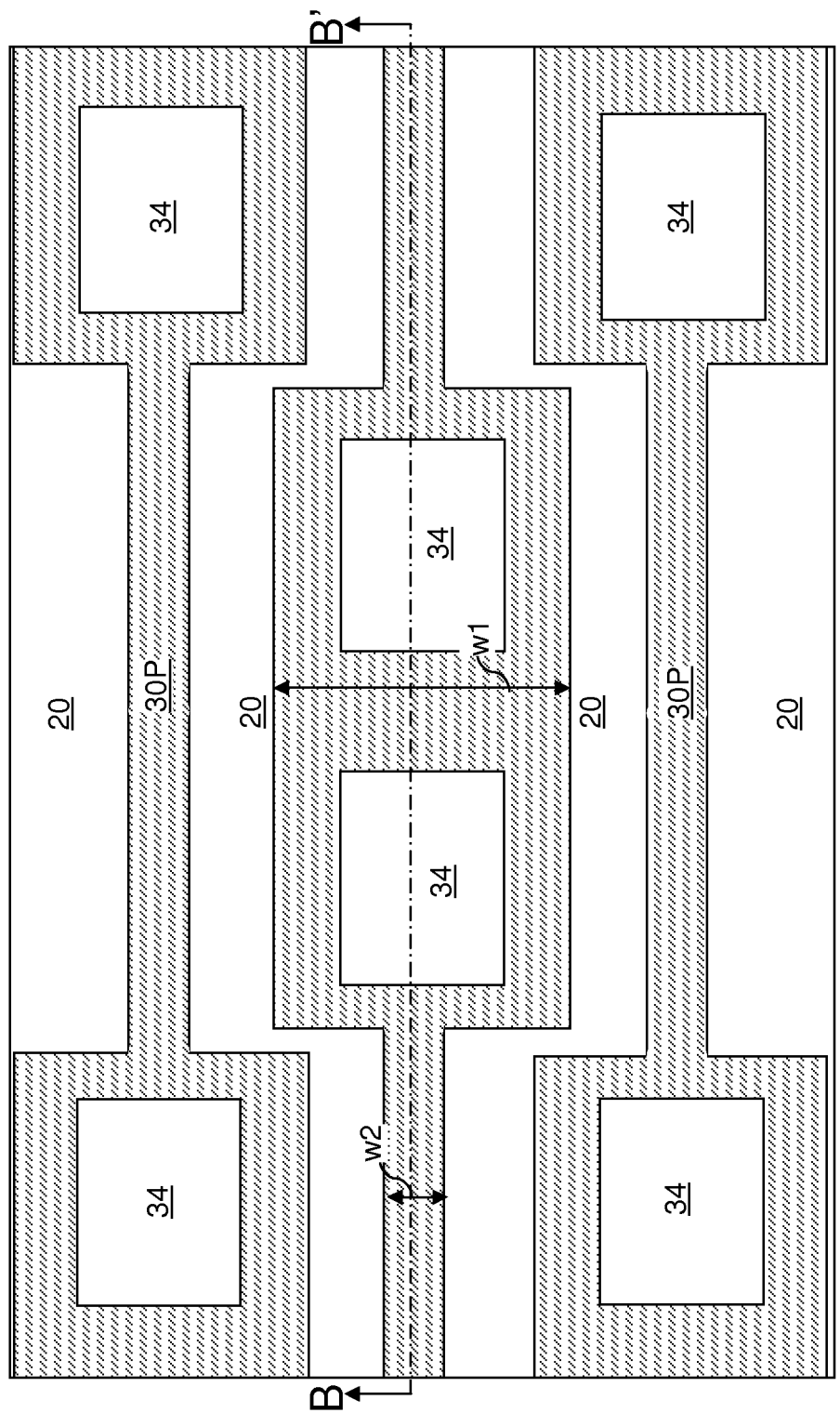
FIG. 3A is a top-down view of the exemplary semiconductor structure after removal of a photoresist according to an embodiment of the present disclosure.
Figure 3B:
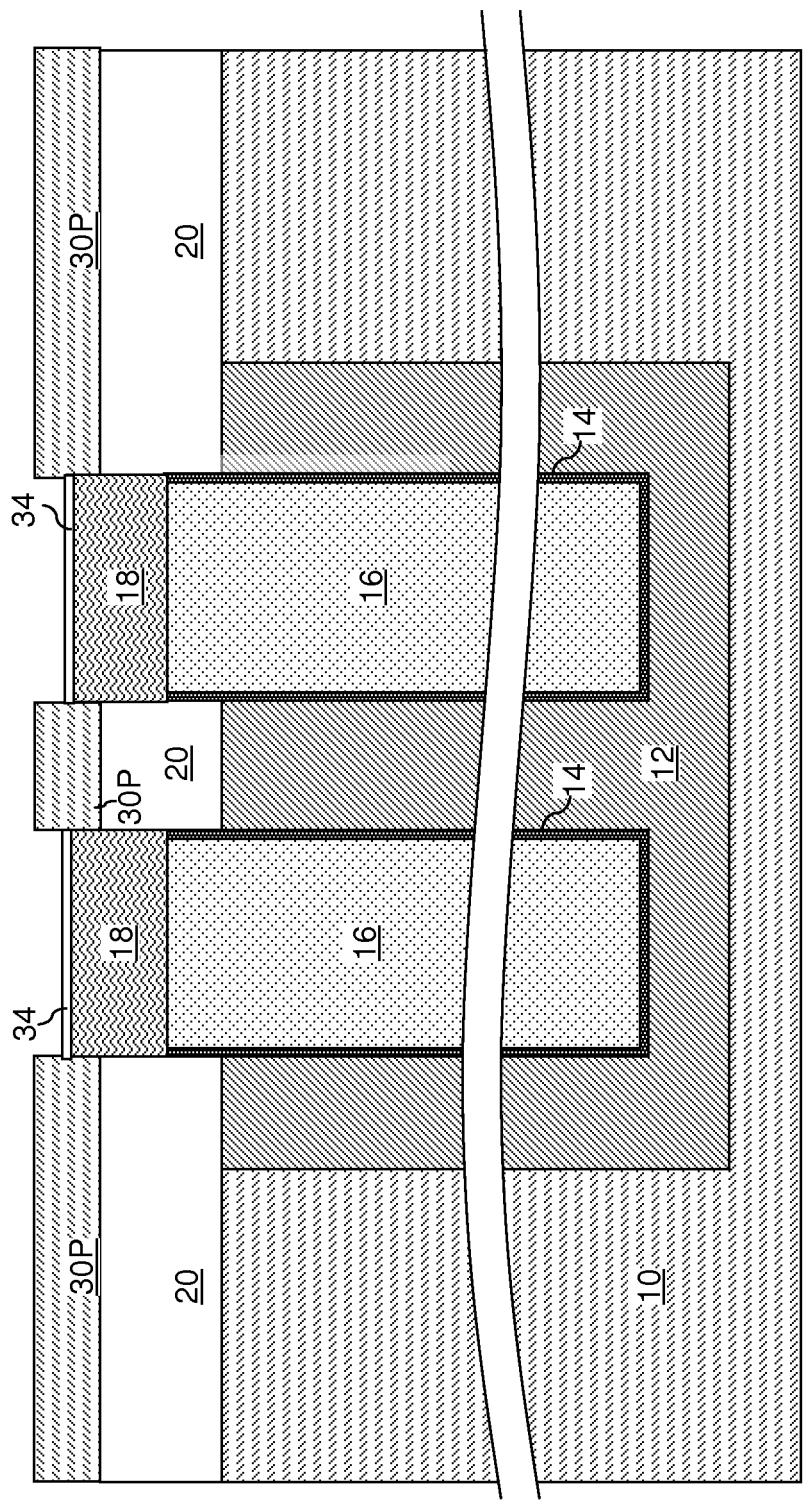
FIG. 3B is a vertical cross-sectional view of the exemplary semiconductor structure along the vertical plane B-B' of FIG. 3A.

Referring to FIGS. 3A and 3B, the photoresist layer 37 is removed selective to the patterned semiconductor material portions 30P and the dielectric cap structures 34, for example, by ashing. Each patterned semiconductor material portion 30P includes at least one first width region having the first width w1 and laterally surrounding two deep trenches and at least one second width region having the second width w2. In one embodiment, the sidewalls of each first width region of a patterned semiconductor material portion 30P are laterally spaced by the first width w1, and the sidewalls of each second width region of the patterned semiconductor material portion 30P are laterally spaced by the second width w2.

Figure 4A:
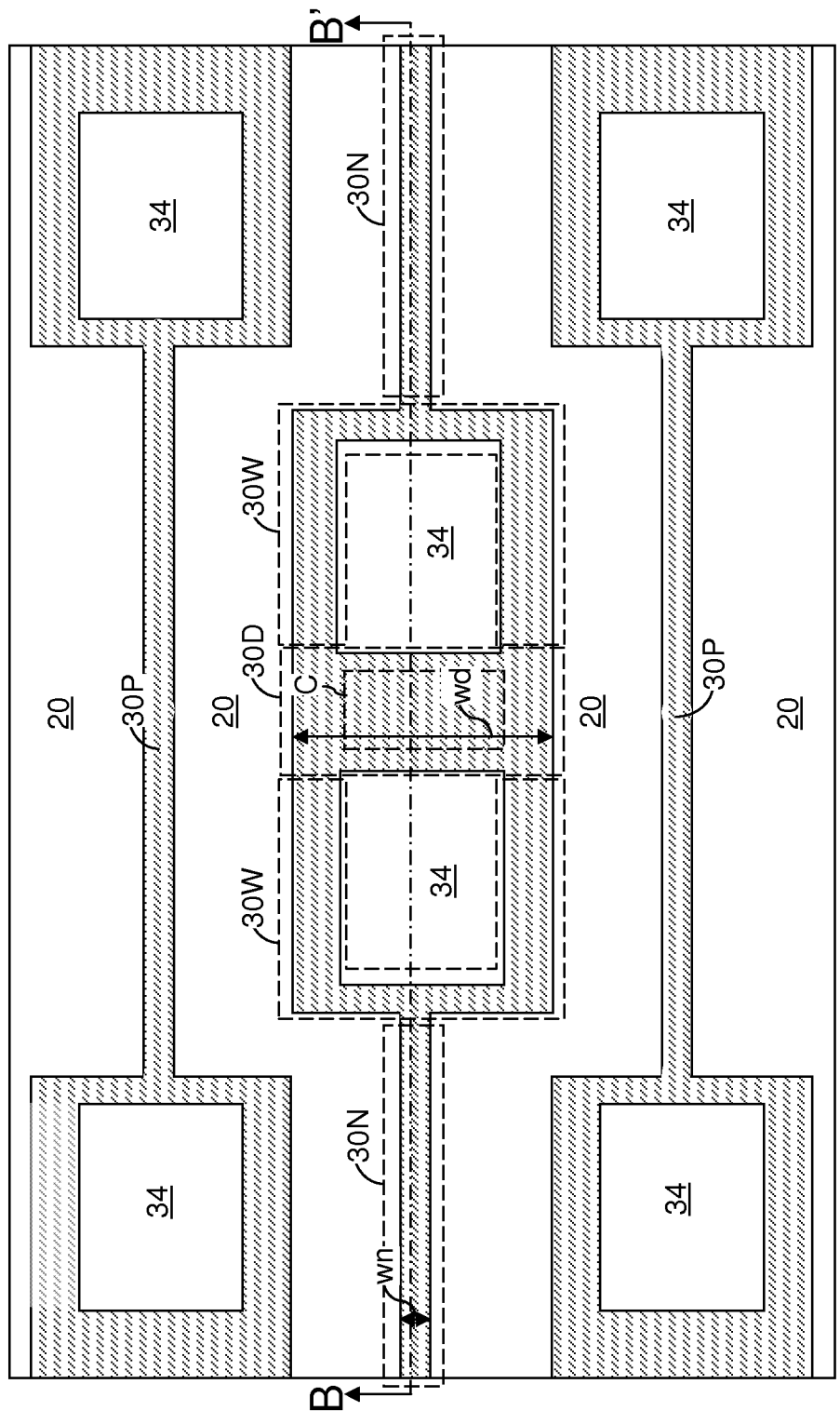
FIG. 4A is a top-down view of the exemplary semiconductor structure after thinning and narrowing of the patterned semiconductor material portions according to an embodiment of the present disclosure.
Figure 4B:
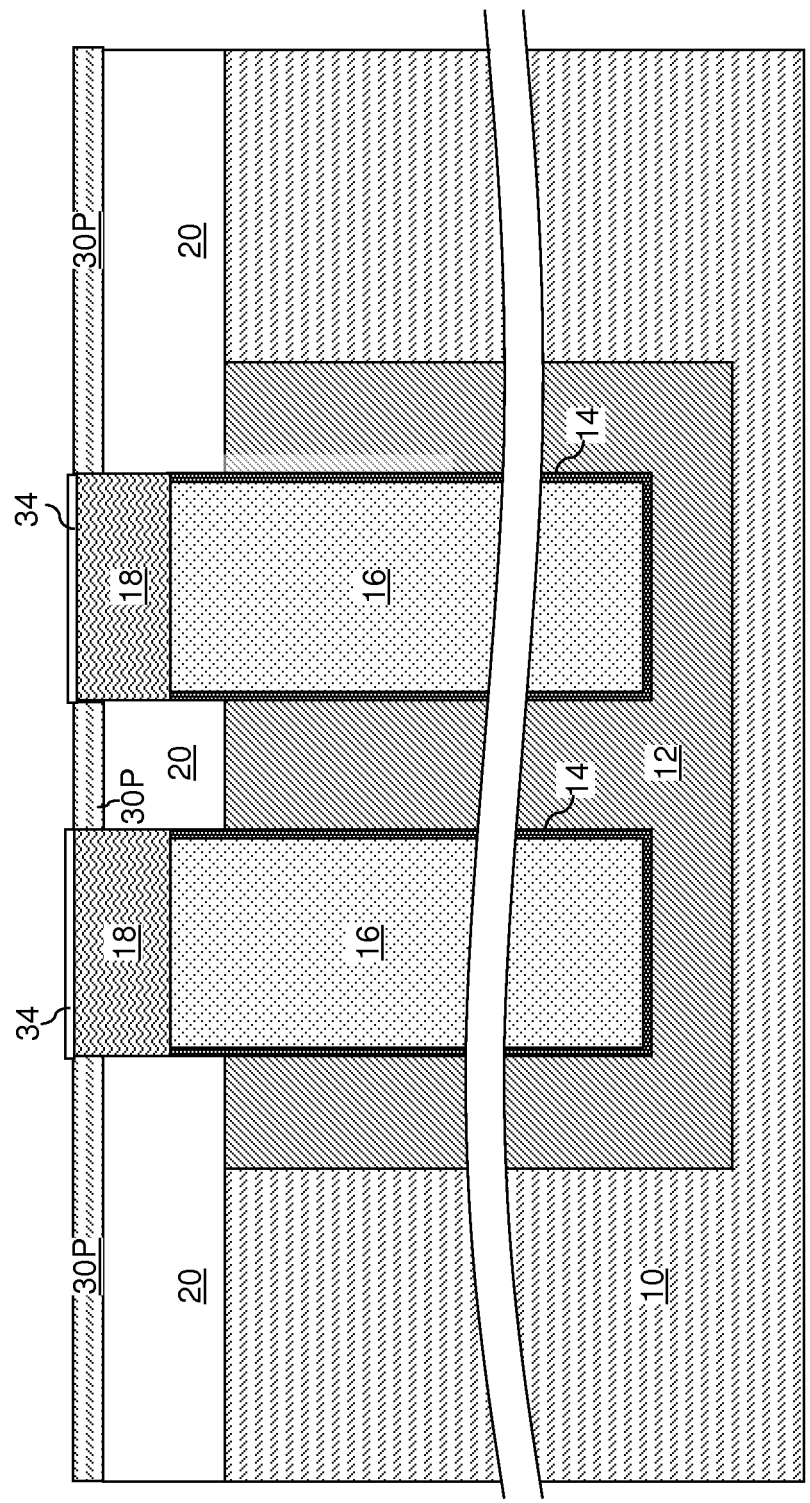
FIG. 4B is a vertical cross-sectional view of the exemplary semiconductor structure along the vertical plane B-B' of FIG. 4A.

Referring to FIGS. 4A and 4B, the exemplary semiconductor structure is subjected to an oxidizing ambient so that surface portions of the semiconductor material of the patterned semiconductor material portions 30P are converted into a semiconductor oxide material. For example, if the patterned semiconductor material portions 30P include silicon, the semiconductor oxide material can include silicon oxide. If the patterned semiconductor material portions 30P include a silicon germanium alloy, the semiconductor oxide material can include a silicon-germanium oxide, i.e., an alloy of silicon oxide and germanium oxide.

The oxidation of the surface portions of the semiconductor material of the patterned semiconductor material portions 30P can be performed, for example, by wet oxidation employing water vapor, dry oxidation employing oxygen, or plasma oxidation employing an oxygen including plasma. Wet oxidation or dry oxidation can be performed, for example, in a furnace configured to provide an oxidizing ambient at an elevated temperature in a range from 600° C. to 1,200° C., although lesser and greater temperatures can also be employed. Plasma oxidation can be performed in a plasma processing chamber as known in the art. The semiconductor oxide material is subsequently removed selective to the semiconductor material of the remaining portions of the patterned semiconductor material portions, for example, by a wet etch, which can employ, for example, a HF based chemistry.

The processing parameters of the oxidation process, including the duration of the oxidation process, are selected such that an unoxidized remaining portion of each second width region of the patterned semiconductor material portions 30P after oxidation has a target width and target height. The target width of the remaining portions of the second width regions of the patterned semiconductor material portions 30P is in a range from 2 nm to 30 nm, although lesser and greater target widths can also be employed. The target height of the remaining portions of the second width regions of patterned semiconductor material portions 30P is in a range from 2 nm to 30 nm, although lesser and greater target heights can also be employed.

Because the target width and the target height of each remaining portion of the second width regions of the patterned semiconductor material portions 30P are on the order of nanometers or tens of nanometers, the remaining portions of the second width regions of patterned semiconductor material portions 30P are herein referred to as semiconductor nanowires 30N. As used herein, a "semiconductor nanowire" refers to a contiguous semiconductor structure extending along a lengthwise direction having at least one uniform lateral dimension in a range between 1 nm and 100 nm in all directions that are perpendicular to the lengthwise direction. For example, a semiconductor nanowire can have a uniform width in a range between 1 nm and 100 nm and a uniform height in a range between 1 nm and 100 nm. Alternately, a semiconductor nanowire can have a shape of a circular cylinder and have a diameter in a range between 1 nm and 100 nm. In one embodiment, each semiconductor nanowire can have a uniform width, which is herein referred to as a nanowire width wn. The nanowire width wn can be, for example, from 2 nm to 30 nm, although lesser and greater nanowire widths wn can also be employed.

A remaining portion of the first width region of each patterned semiconductor material portion 30P is present between each pair of adjacent deep trenches. This portion is herein referred to as a pad portion 30D, and the width of each pad portion is herein referred to as a pad width wd. Sidewalls of each conductive cap structure 18 that are not contacted by a pad portion 30D are laterally contacted by another remaining portion of a patterned semiconductor material portion 30P, which is herein referred to as a wraparound semiconductor portion 30W. A pad portion 30D can be laterally adjoined to two wraparound semiconductor portions 30W.

Thus, each patterned semiconductor material structure 30P after the oxidation process and the removal of the semiconductor oxide material formed by the oxidation process can include at least one semiconductor nanowire 30N laterally adjoined to two wraparound semiconductor portions 30W, at least two wraparound semiconductor portions 30W, and at least one pad portions 30D. Each wraparound semiconductor portion 30W can be adjoined to a semiconductor nanowire 30N and a pad portion 30D. Each pad portion 30D can be adjoined to two wraparound semiconductor portions 30W. A portion of each sidewall of the conductive cap structure 18 is laterally contacted by a pad portion 30D or a wraparound semiconductor portion 30W.

Each pad portion 30D can include a center portion C, which is laterally spaced from the physically exposed sidewall surfaces of the remaining portions of the patterned semiconductor material structure 30P by a distance that is greater than the maximum distance between any point within the semiconductor nanowires 30N and the physically exposed sidewall surfaces of the remaining portions of the patterned semiconductor material structure 30P.

Figure 5A:
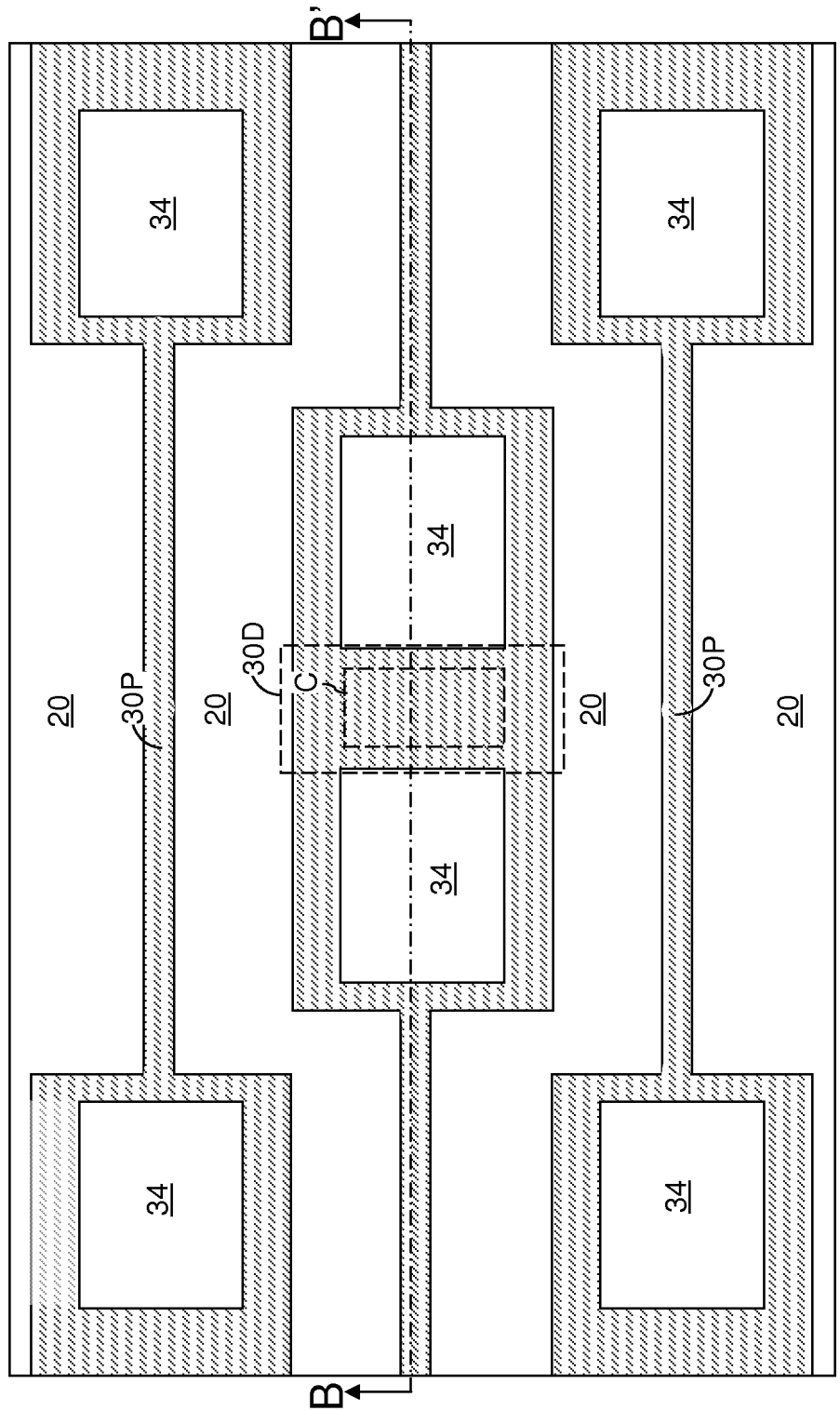
FIG. 5A is a top-down view of the exemplary semiconductor structure after undercutting semiconductor nanowires and wraparound semiconductor portions by removing portions of the buried insulator layer according to an embodiment of the present disclosure.
Figure 5B:
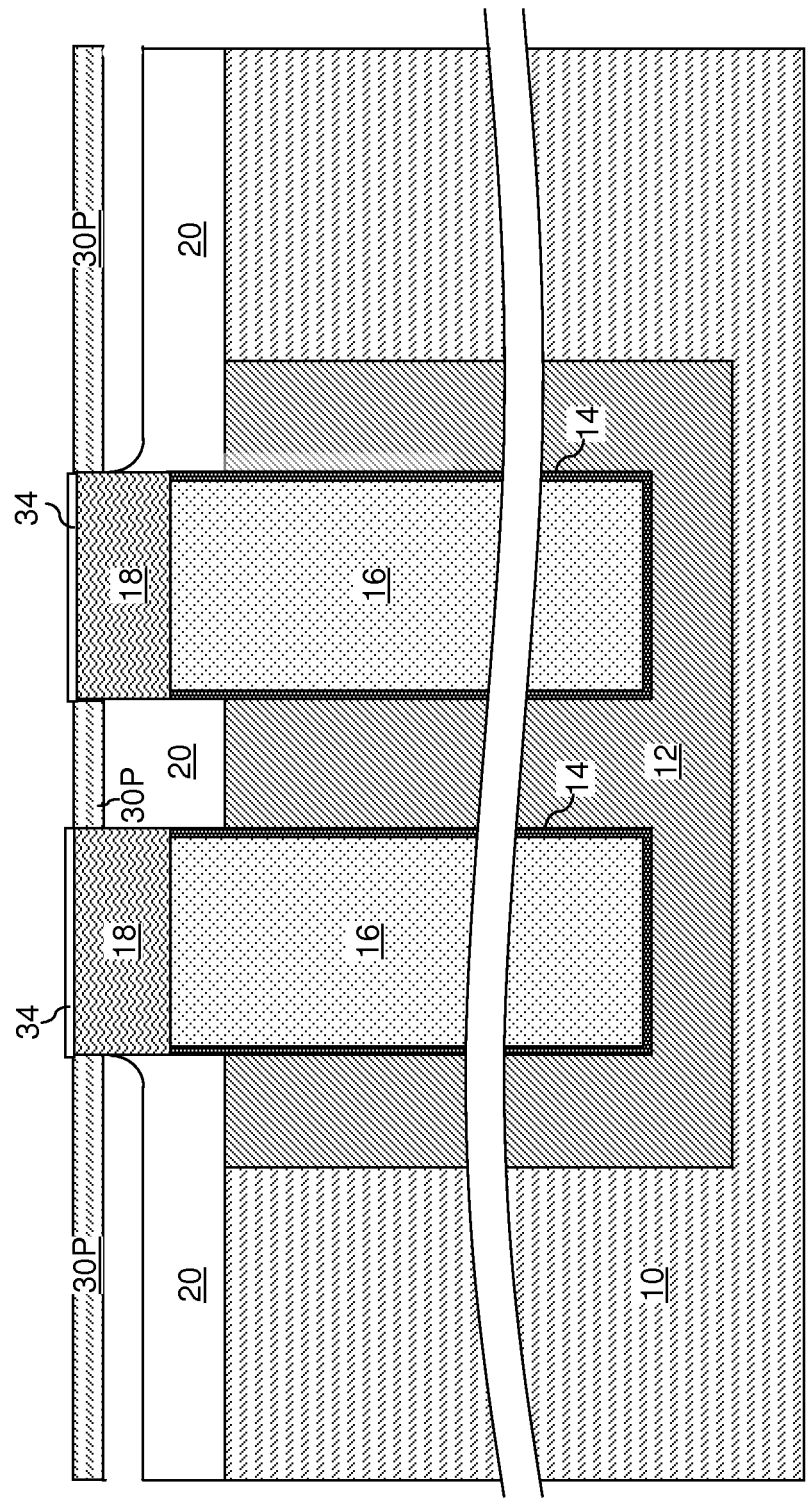
FIG. 5B is a vertical cross-sectional view of the exemplary semiconductor structure along the vertical plane B-B' of FIG. 5A.

Referring to FIGS. 5A and 5B, portions of the buried insulator layer 20 underlying semiconductor nanowires 30N and wraparound semiconductor portions 30W are removed employing an isotropic etch such as a wet etch. For example, a HF-based wet etch can be employed to undercut the semiconductor nanowires 30N and wraparound semiconductor portions 30W. The duration of the isotropic etch is selected such that all bottom surfaces of the semiconductor nanowires 30N become spaced from the recessed top surface of the buried insulator layer 20, i.e., do not contact the recessed top surface of the buried insulator layer 20. Further, the duration of the isotropic etch is selected such that the center portion C of the pad portion 30D is not undercut by the isotropic etch.

Thus, the physical contact between the bottom surfaces of the center portions C of the pad portions 30D and the unetched top surface of the buried insulator layer provides mechanical support for the semiconductor nanowires 30N and the wraparound semiconductor portions 30W. A semiconductor nanowire 30N and a pair of adjoining wraparound semiconductor portions 30W can be suspended over the recessed surface of the buried insulator layer 20 by a pair of center portions C of the pad portions 30D. A portion of sidewalls of each conductive cap structure 18 can be physically exposed underneath each wraparound semiconductor portion 30W.

Each semiconductor nanowire 30N overlies the buried insulator layer 20. Each semiconductor nanowire 30N is vertically spaced from a planar top surface of the buried insulator layer 20, which is the surface of the recessed portion of the buried insulator layer 20. The lengthwise direction of the semiconductor nanowire 30N is horizontal, and thus, is parallel to the planar top surface of the buried insulator layer 20. The planar top surface of the buried insulator layer 20 is adjoined to each curved top surface of the buried insulator layer 20 that is adjoined to a conductive cap structure 18.

Figure 6A:
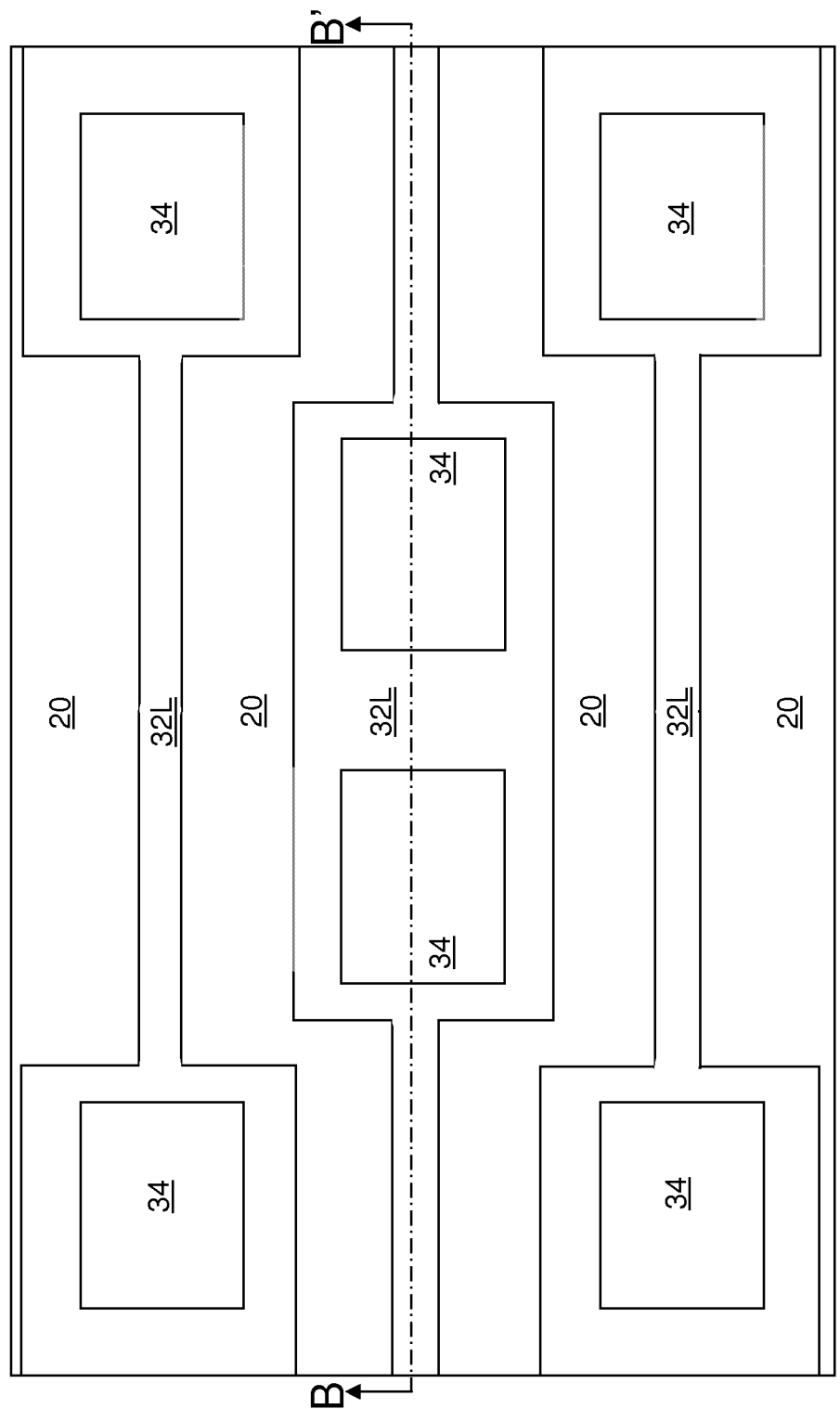
FIG. 6A is a top-down view of the exemplary semiconductor structure after formation of a gate dielectric layer according to an embodiment of the present disclosure.
Figure 6B:
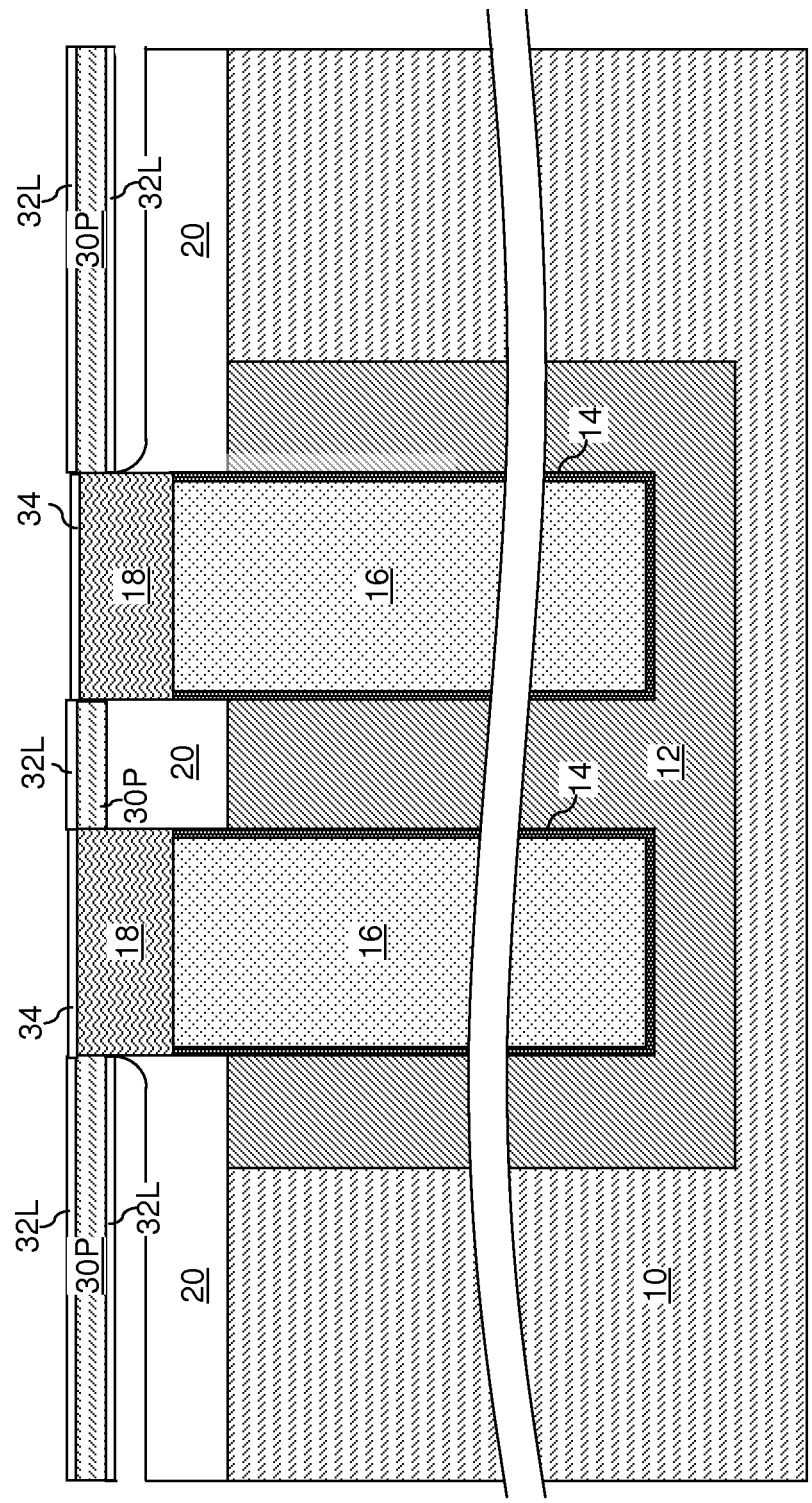
FIG. 6B is a vertical cross-sectional view of the exemplary semiconductor structure along the vertical plane B-B' of FIG. 6A.

Referring to FIGS. 6A and 6B, a gate dielectric layer 32L can be formed at least on the semiconductor surfaces of the patterned semiconductor material portions 30P. In one embodiment, the gate dielectric layer 32L can be formed by converting surface portions of the patterned semiconductor material portions 30P into a dielectric semiconductor-containing material such as a dielectric semiconductor oxide, a dielectric semiconductor nitride, a dielectric semiconductor oxynitride, or a combination thereof. For example, if the patterned semiconductor material portions 30P include silicon, the dielectric semiconductor-containing material can be silicon oxide, silicon nitride, silicon oxynitride, or a combination thereof. The thickness of the gate dielectric layer 32L can be, for example, from 0.5 nm to 6 nm, although lesser and greater thicknesses can also be employed.

Alternately or additionally, the gate dielectric layer 32L can be formed by depositing a dielectric material. In one embodiment, the material of the gate dielectric layer 32L can be deposited by a conformal deposition method such as atomic layer deposition (ALD) and/or chemical vapor deposition (CVD). In one embodiment, the deposited dielectric material can include a dielectric semiconductor oxide such as silicon oxide. Alternately or additionally, the deposited dielectric material can include a dielectric metal oxide, a dielectric metal nitride, and/or a dielectric metal oxynitride. In one embodiment, the deposited dielectric material can include a high-dielectric constant (high-k) gate dielectric material known in the art.

The gate dielectric layer 32L contiguously surrounds each semiconductor nanowire 30N around the lengthwise direction of the semiconductor nanowire 30N. The bottom portion of the gate dielectric layer 32L on the bottom surface of each semiconductor nanowire 30N can overlie, and can be vertically spaced from, the planar top surface of the buried insulator layer 20, which is the recessed surface of the buried insulator layer 20.

Figure 7A:
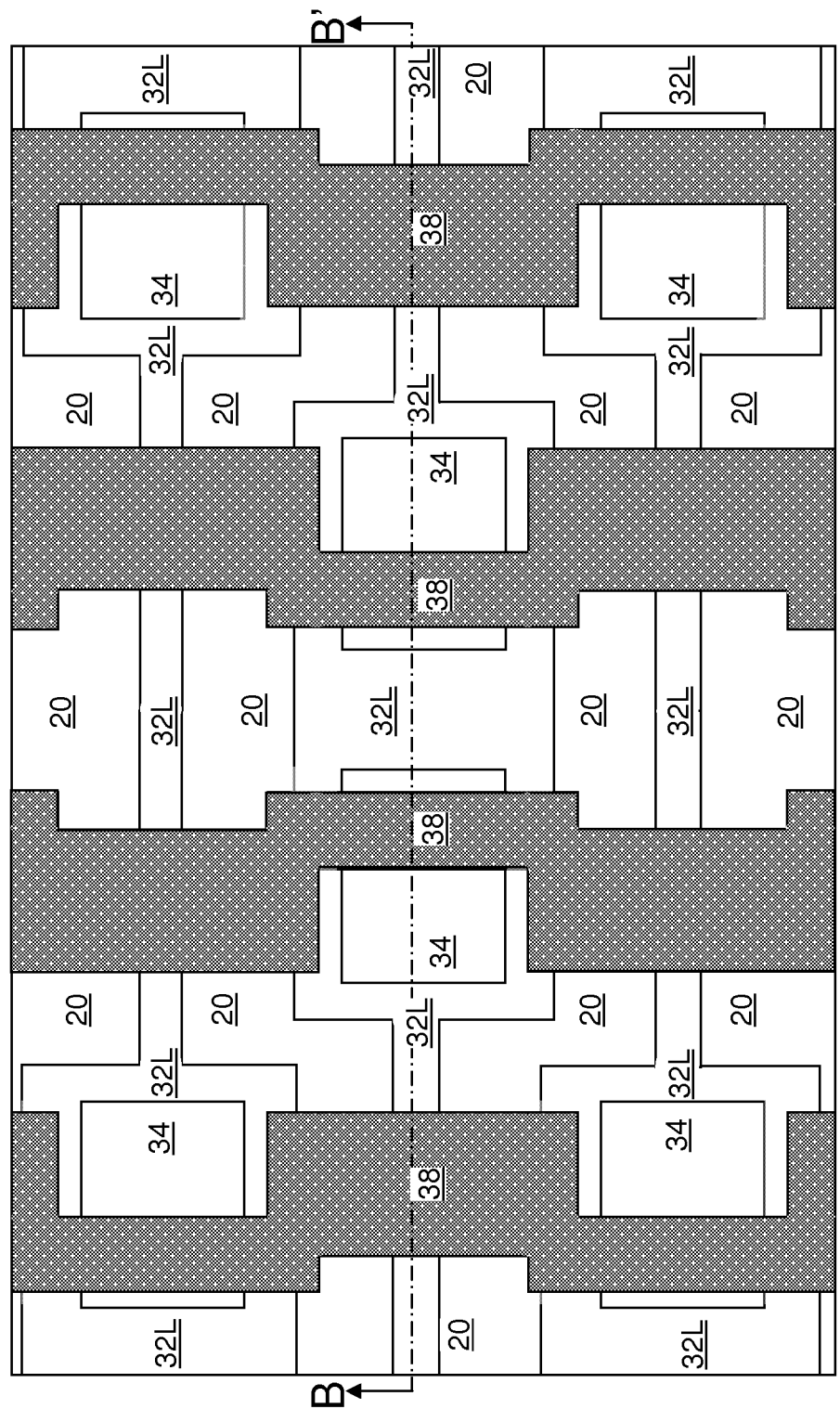
FIG. 7A is a top-down view of the exemplary semiconductor structure after formation of gate stacks according to an embodiment of the present disclosure.
Figure 7B:
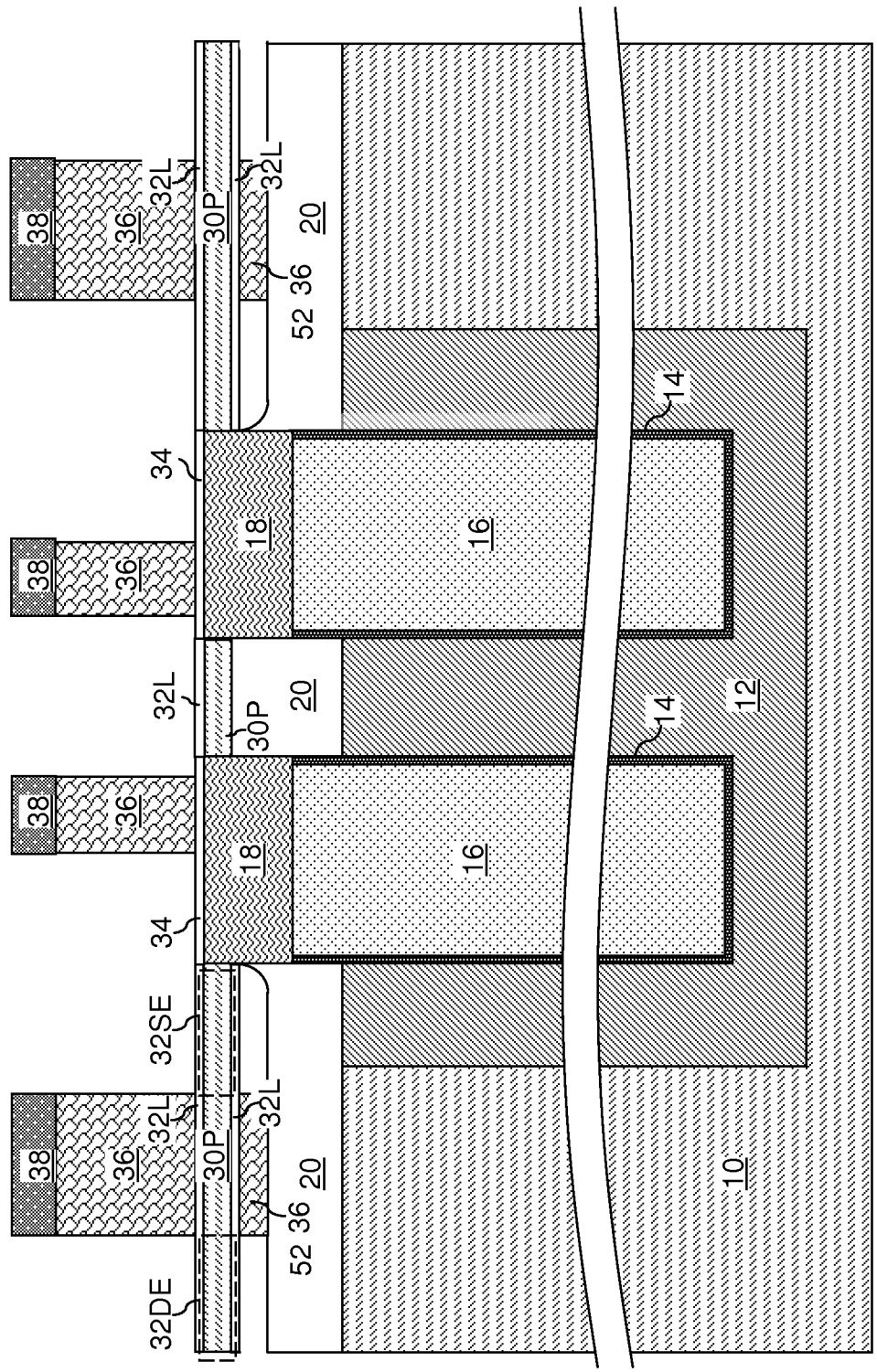
FIG. 7B is a vertical cross-sectional view of the exemplary semiconductor structure along the vertical plane B-B' of FIG. 7A.

Referring to FIGS. 7A and 7B, gate stacks are formed over center portions of the semiconductor nanowires 30N and over the deep trench capacitors. For example, a gate electrode layer and a dielectric gate cap layer can be deposited, and subsequently patterned to form the gate stacks. Each remaining portion of the gate electrode layer constitutes a gate electrode 36, and each remaining portion of the dielectric gate cap layer constitutes a dielectric gate cap 38.

The gate electrode layer includes a conductive material, which can include a doped semiconductor material, a metallic material, or combinations thereof. The gate electrode layer can be deposited, for example, by chemical vapor deposition (CVD), physical vapor deposition (PVD), or any other known method for depositing a conductive material. The thickness of the gate electrode layer, as measured above the deep trenches, can be from 20 nm to 300 nm, although lesser and greater thicknesses can also be employed. The gate electrode layer is deposited underneath each semiconductor nanowire 30N.

The dielectric gate cap layer includes a dielectric material such as silicon nitride, silicon oxide, silicon oxynitride, and/or a dielectric metal oxide. The dielectric gate cap layer can be deposited, for example, by chemical vapor deposition. The thickness of the dielectric gate cap layer can be from 5 nm to 50 nm, although lesser and greater thicknesses can also be employed.

The dielectric gate cap layer and the gate electrode layer are patterned, for example, by applying a photoresist layer (not shown) over the dielectric gate cap layer, patterning the photoresist layer by lithographic methods, and by transferring the pattern in the photoresist layer into the stack of the dielectric gate cap layer and the gate electrode layer by an etch. The etch can include an anisotropic etch such as a reactive ion etch, which transfers the pattern in the photoresist layer into the stack of the dielectric gate cap layer and the gate electrode layer. The chemistry of the etch can be selected such that the material of the gate dielectric layer 32L is not etched during the etching of the gate electrode layer. Thus, the etch can stop on the surface of the gate dielectric layer 32L.

Once the top surface of the buried insulator layer 20 is physically exposed in areas that are not covered by the patterned photoresist layer, an isotropic etch can be employed to laterally etch the material of the gate electrode layer and to optionally laterally etch the material of the dielectric gate cap layer. The lateral etch of the material of the gate electrode layer can proceed until the material of the gate electrode layer is removed from underneath portions of the semiconductor nanowires 30N that are not covered by the photoresist layer. The photoresist layer can be subsequently removed, for example, by ashing.

Each gate electrode 36 formed on a center portions of any semiconductor nanowire 30N can be a wraparound gate electrode portion, which circumferentially wraps around the semiconductor nanowire 30N. The wraparound gate electrode portion contiguously surrounds the semiconductor nanowire 30N around a lengthwise direction of the semiconductor nanowire 30N. Each wraparound gate electrode portion is spaced from a semiconductor nanowire by the gate dielectric layer 32L. Each wraparound gate electrode portion can physically contact the planar top surface at the recessed portions of the buried insulator layer 20.

A portion of each gate electrode 36 that overlies a deep trench capacitor is herein referred to as a passing gate electrode portion. Each passing gate electrode portion can be integrally formed with at least one wraparound gate electrode portion. In other words, a gate electrode 36 can include at least one wraparound gate electrode portion that wraps around a semiconductor nanowire 30N and at least one passing gate electrode portion that overlies a deep trench capacitor. Each passing gate electrode portion is electrically isolated from the deep trench capacitor underneath by the dielectric cap structure 34. Sub-portions of the wraparound semiconductor portions 30W underlie passing gate electrode portions, and laterally contact a conductive cap structure 18.

Optionally, electrical dopants, such as B, In, Ga, P, As, and/or Sb, can be implanted into the portions of the semiconductor nanowires 30N that do not underlie the gate electrodes 36, for example, by ion implantation. The implanted portions of the semiconductor nanowires 30N can be doped with the electrical dopants, and can become source extension regions 32SE that contact the conductive cap structures 18 or drain extension regions 32DE that do not contact the conductive cap structures 18. In one embodiment, a drain extension region 32DE can be formed in a portion of a semiconductor nanowire 30N located between a pair of gate electrodes 36.

Figure 8A:
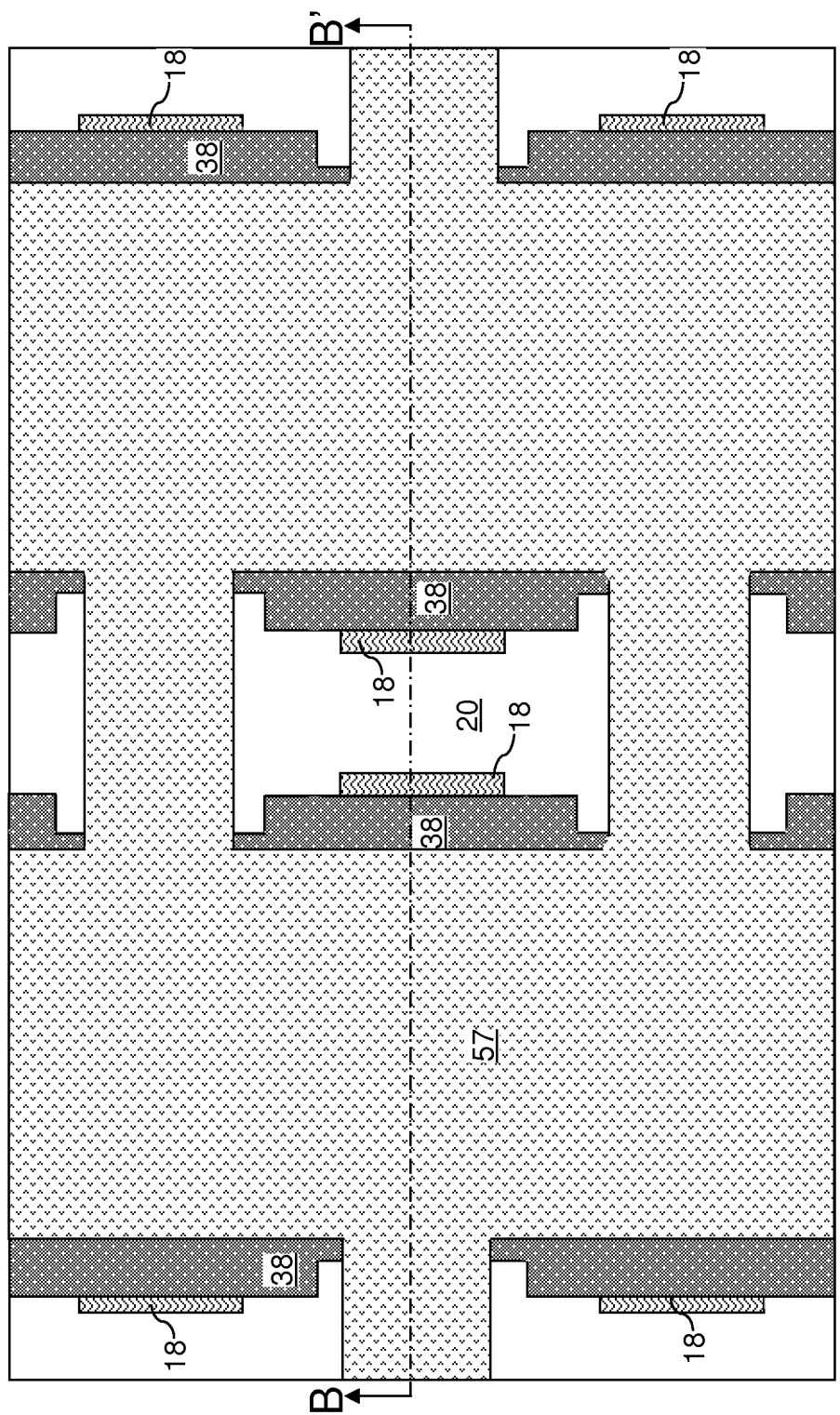
FIG. 8A is a top-down view of the exemplary semiconductor structure after removal of pad portions of the patterned semiconductor material portions according to an embodiment of the present disclosure.
Figure 8B:
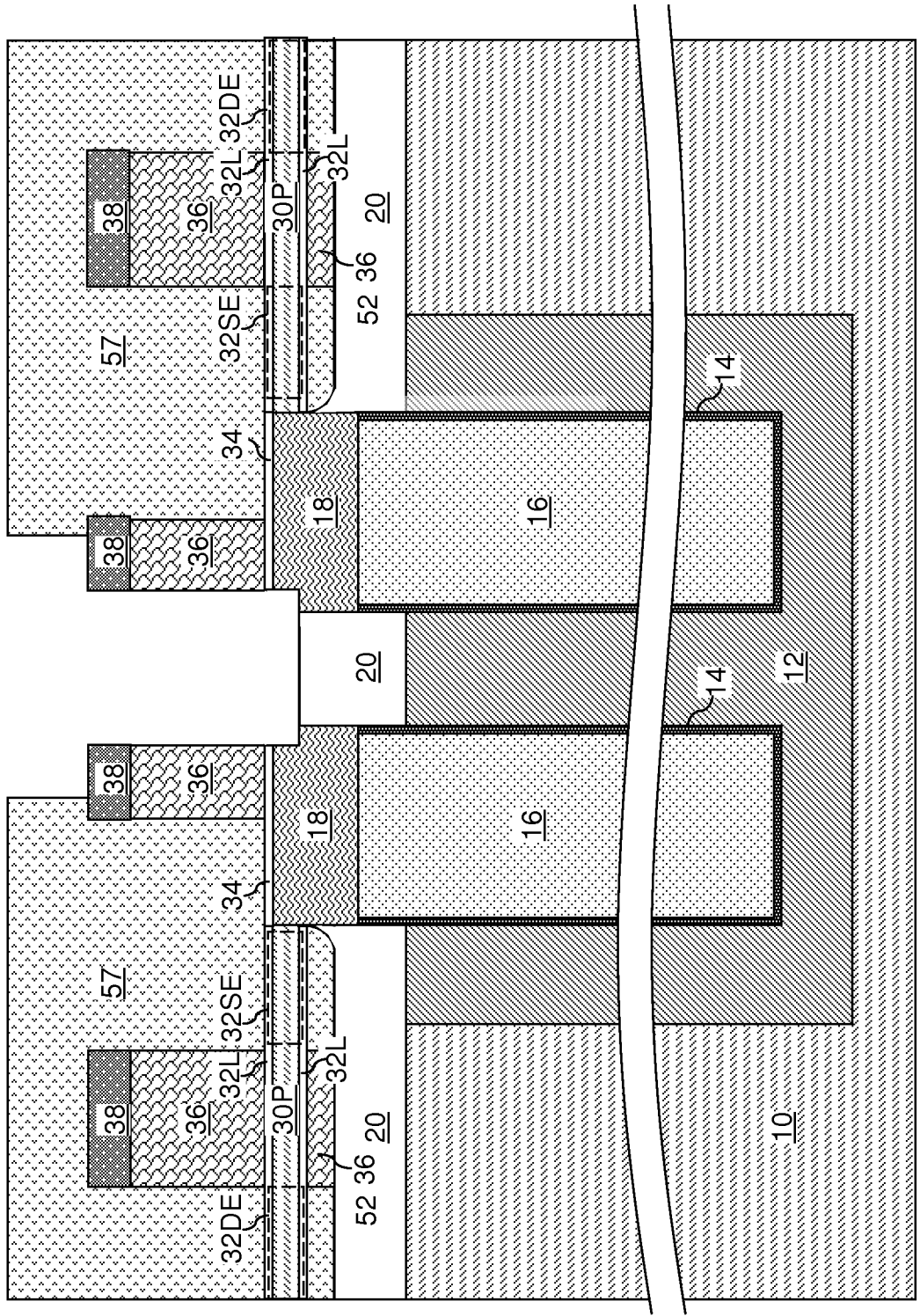
FIG. 8B is a vertical cross-sectional view of the exemplary semiconductor structure along the vertical plane B-B' of FIG. 8A.

Referring to FIGS. 8A and 8B, a photoresist layer 57 can be applied over the first exemplary structure and lithographically patterned to form openings in areas including the pad portions 30D of the patterned semiconductor material portions 30P. An anisotropic etch can be employed to remove portions of the gate dielectric layer 30L and the patterned semiconductor material portions 30P from within the areas of the openings in the patterned photoresist layer 57. All pad portions 30D can be removed by the anisotropic etch. In one embodiment, the portions of the dielectric cap structures 34 that are located within the areas of the openings in the photoresist layer 57 can be removed during the anisotropic etch. In one embodiment, the portions of the conductive cap structures 18 that are located within the areas of the openings in the photoresist layer 57 can be recessed during the anisotropic etch.

Figure 9A:
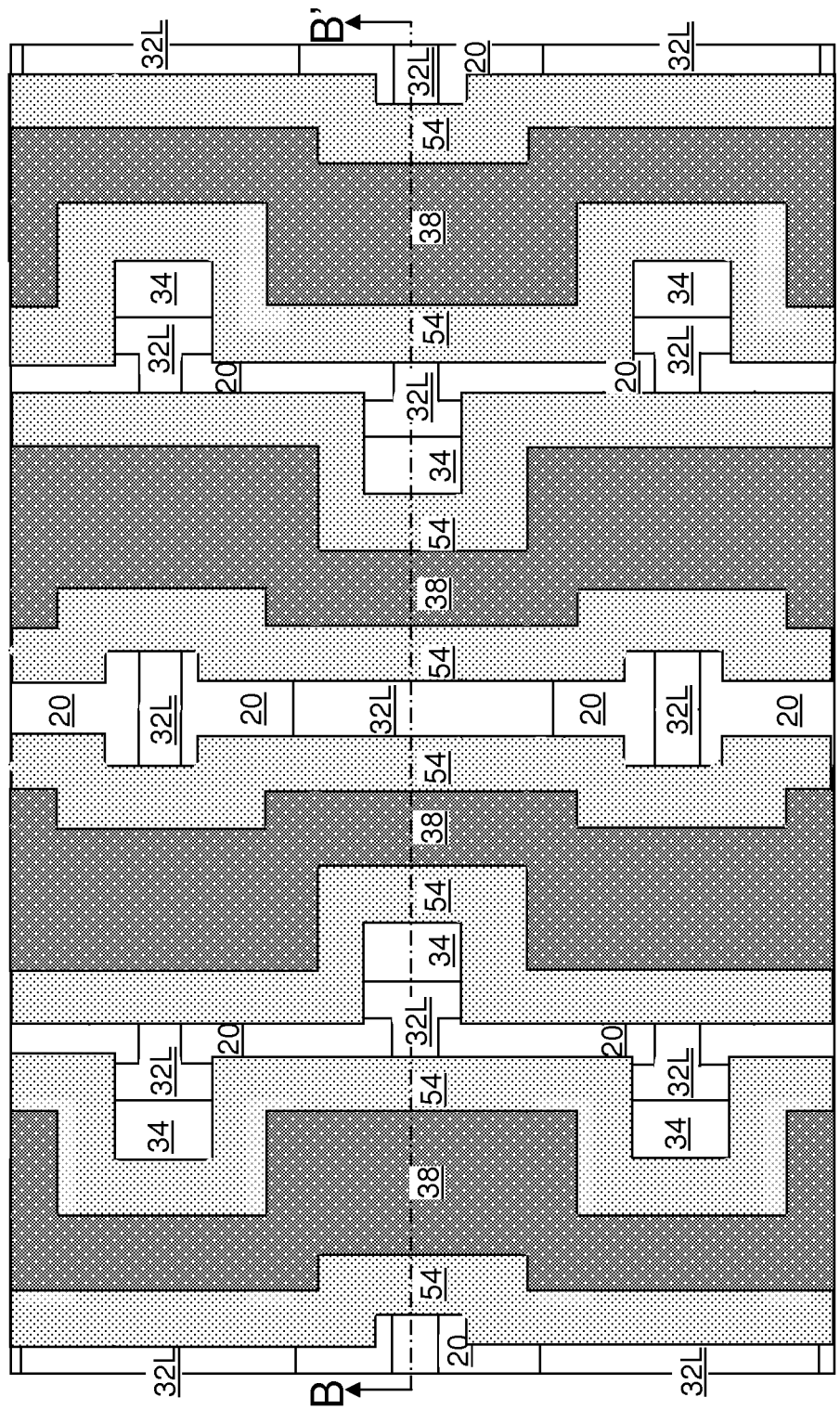
FIG. 9A is a top-down view of the exemplary semiconductor structure after formation of gate spacers according to an embodiment of the present disclosure.
Figure 9B:
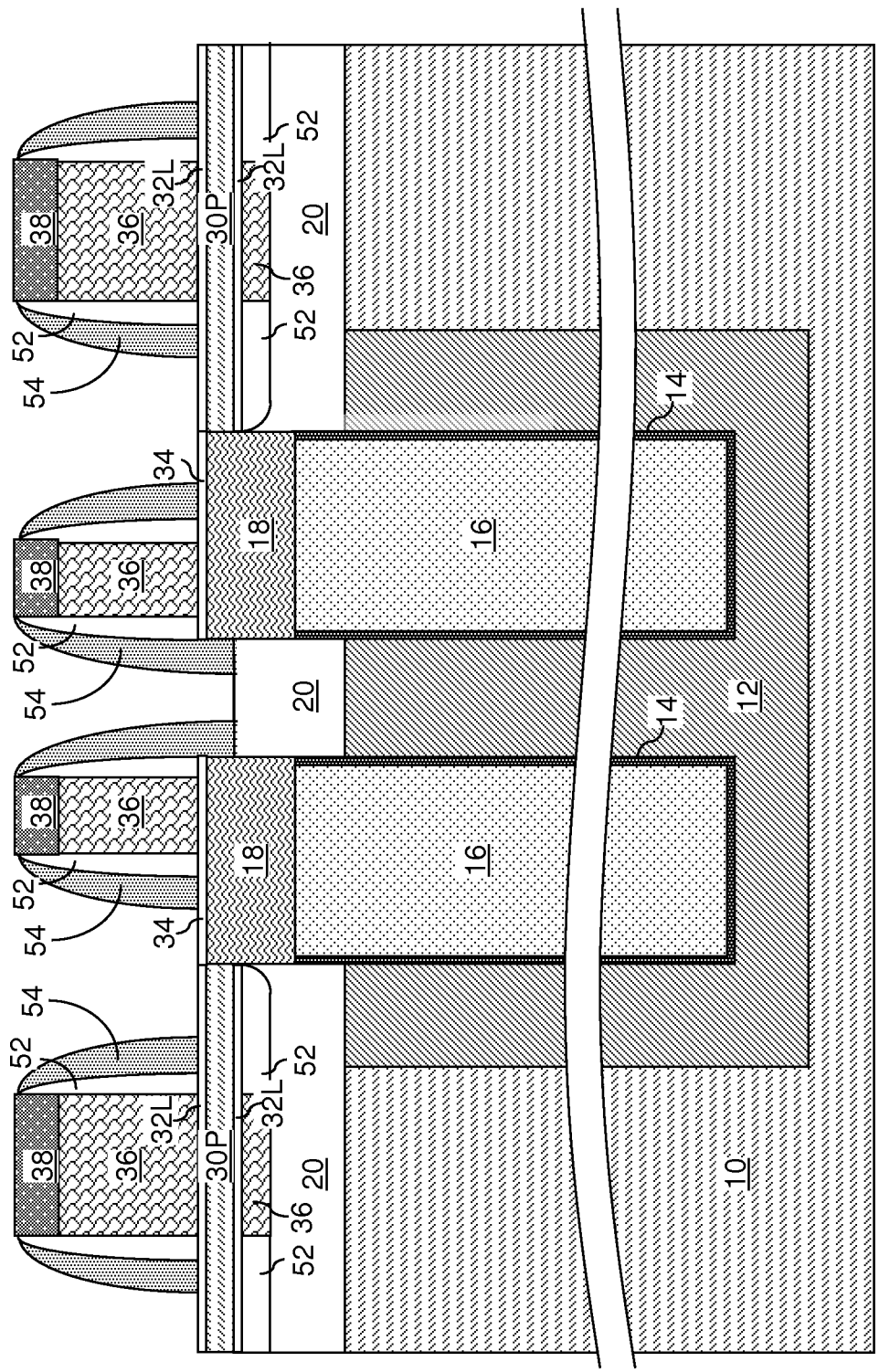
FIG. 9B is a vertical cross-sectional view of the exemplary semiconductor structure along the vertical plane B-B' of FIG. 9A.

Referring to FIGS. 9A and 9B, at least one gate spacer is formed by depositing dielectric material layers and removing vertical portions of the dielectric material layers by anisotropic etches. For example, first gate spacers 52 can be formed directly on vertical sidewalls of the gate electrodes 36 and the dielectric gate caps 38 and underneath the semiconductor nanowires 36N by depositing a first conformal dielectric material layer and by anisotropically etching physically exposed horizontal portions of the first conformal dielectric material layer. Subsequently, second gate spacers 54 can be formed on outer sidewalls of the first gate spacers 52 by depositing a second conformal dielectric material layer and by anisotropically etching horizontal portions of the second conformal dielectric material layer.

The first gate spacers 52 and the second gate spacers 54 can include different dielectric materials, which can be selected from, for example, silicon oxide, silicon nitride, and silicon oxynitride. The first gate spacers 52 can contact all sidewalls of the wraparound gate electrode portions. Further, the first gate spacers 52 can contact the planar top surface of the recessed portions of the buried insulator layer 20.

Figure 10A:
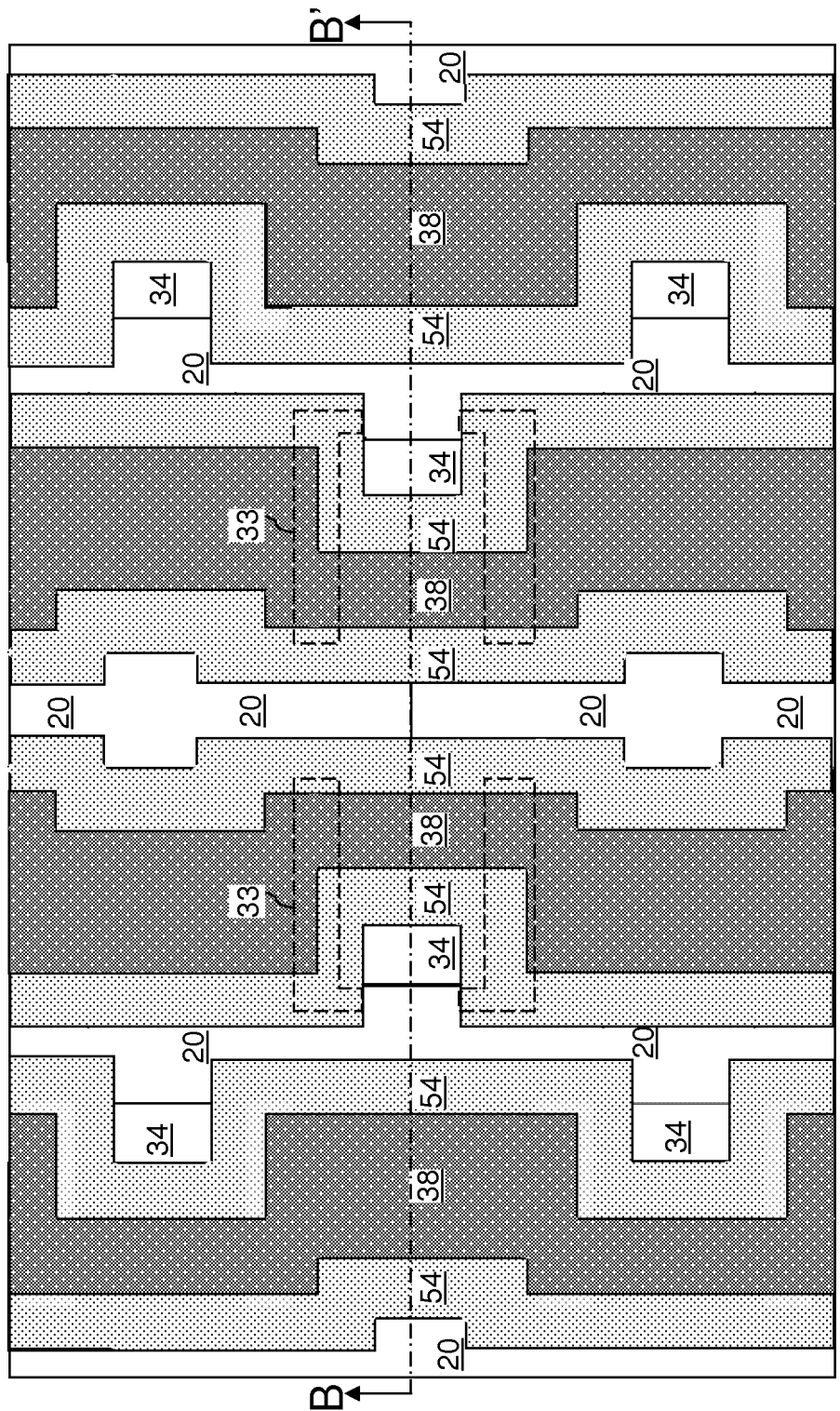
FIG. 10A is a top-down view of the exemplary semiconductor structure after removal of physically exposed portions of the patterned semiconductor material structures according to an embodiment of the present disclosure.
Figure 10B:
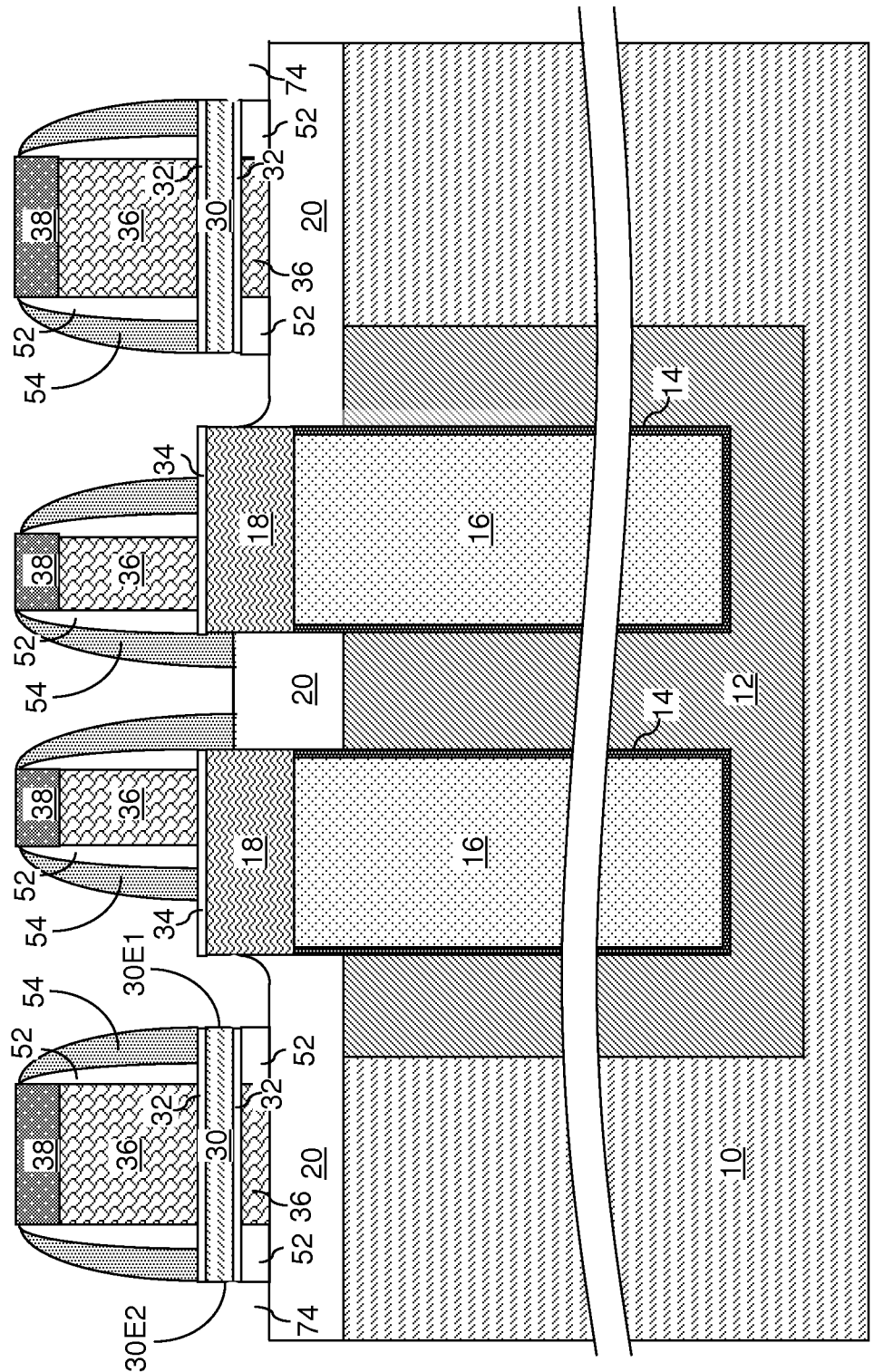
FIG. 10B is a vertical cross-sectional view of the exemplary semiconductor structure along the vertical plane B-B' of FIG. 10A.

Referring to FIGS. 10A and 10B, portions of the patterned semiconductor structures 30P that are not covered by the dielectric gate caps 38 or the gate spacers (52, 54) are removed by an anisotropic etch. The anisotropic etch removes the dielectric material of the physically exposed portions of the gate dielectric layer 32L and the semiconductor material of the patterned semiconductor material portions that do not underlie the dielectric gate caps 38 or the gate spacers (52, 54).

Thus, portions of the semiconductor nanowires 30N that do not underlie the gate electrodes 36 or the gate spacers (52, 54) are etched by the anisotropic etch. Portions of each semiconductor nanowire 30N that adjoin wraparound semiconductor portions 30W are removed by the anisotropic etch. Further, portions of each semiconductor nanowire 30N that are located between a pair of outermost surfaces of the gate spacers (52, 54) are removed so that a semiconductor nanowire 30N is divided into two semiconductor nanowire portions, each of which is herein referred to as a semiconductor nanowire 30. Each remaining portion of the gate dielectric layer 32L located on the semiconductor nanowires 30 constitutes a gate dielectric 30.

A first end surface 30E1 of each semiconductor nanowire 30, which is physically exposed after the anisotropic etch, can face a conductive cap structure 18. A second end surface 30E2 of each semiconductor nanowire 30, which is physically exposed after the anisotropic etch, can face another second end surface 30E2 of another semiconductor nanowire 20. The first and second end surfaces (30E1, 30E2) of the semiconductor nanowires 30 are perpendicular to the lengthwise direction of the semiconductor nanowire 30. Because the gate spacers (52, 54) are employed as an etch mask during the anisotropic etch, the first and second end surfaces (30E1, 30E2) of the semiconductor nanowires 30 can be vertically coincident with vertical portions of outer surfaces of the at least one gate spacer (52, 54), i.e., the vertical portions of the outermost surfaces of the second gate spacers 54.

Sub-portions of the pad portions 30D are removed concurrently with the removal of the portions of the semiconductor nanowires that are not covered by the dielectric gate caps 38 or the gate spacers (52, 54). Remaining portions of the wraparound semiconductor portions 30W and the pad portions 30D are present underneath the passing gate electrode portions of the gate electrodes 36. The remaining portions of the wraparound semiconductor portions 30W and the pad portions 30D are semiconductor material portions having a same composition and thickness the portions of the semiconductor nanowires 30 that are surrounded by the wrapping gate electrode portions of the gate electrodes 36, and are herein referred to as conductive-cap-contacting semiconductor material portions 33. The portions of the semiconductor nanowires 30 that are surrounded by the wrapping gate electrode portions of the gate electrodes 36 are subsequently employed as body regions of field effect transistors formed employing the semiconductor nanowires 30.

Figure 11A:
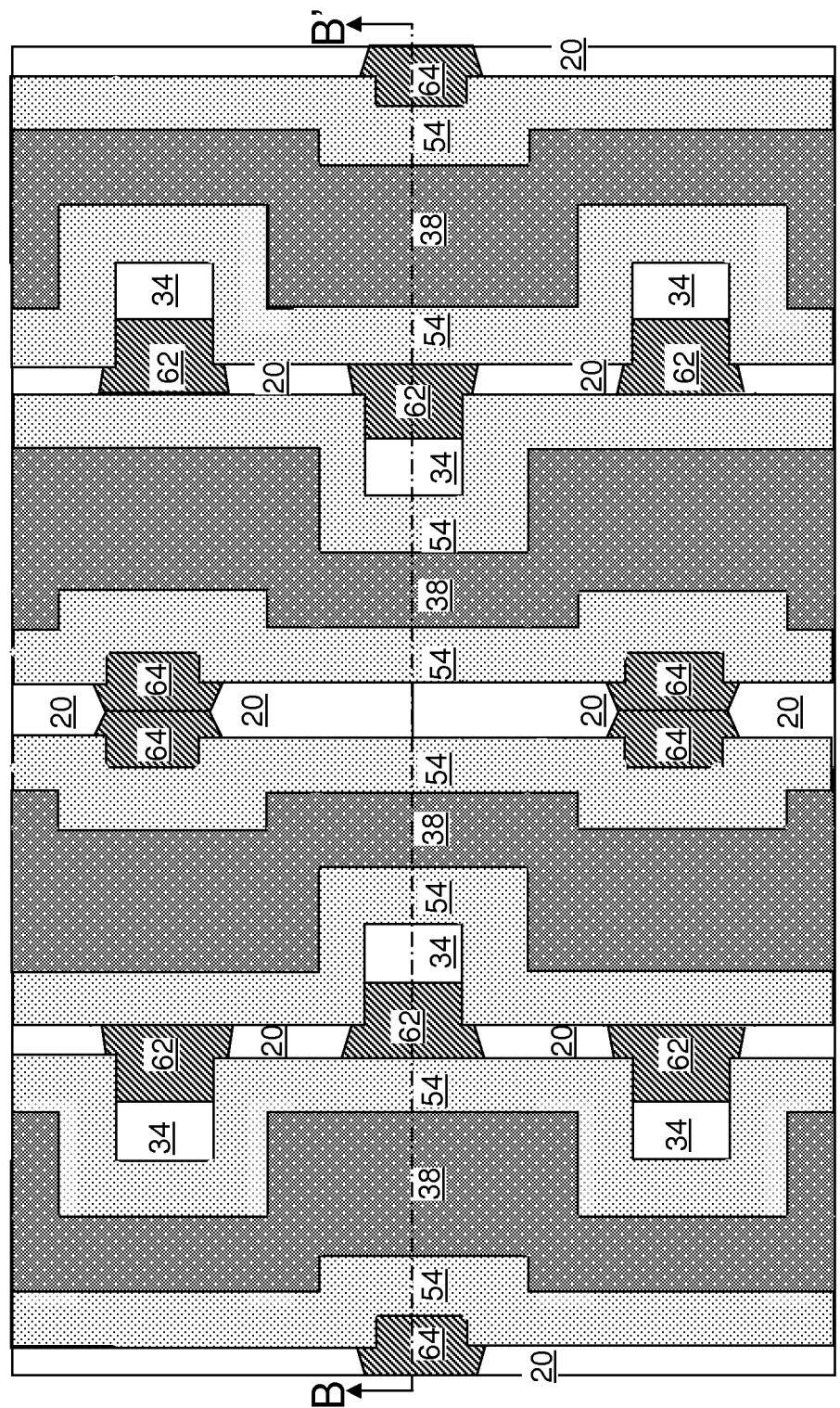
FIG. 11A is a top-down view of the exemplary semiconductor structure after selective deposition of source and drain regions according to an embodiment of the present disclosure.
Figure 11B:
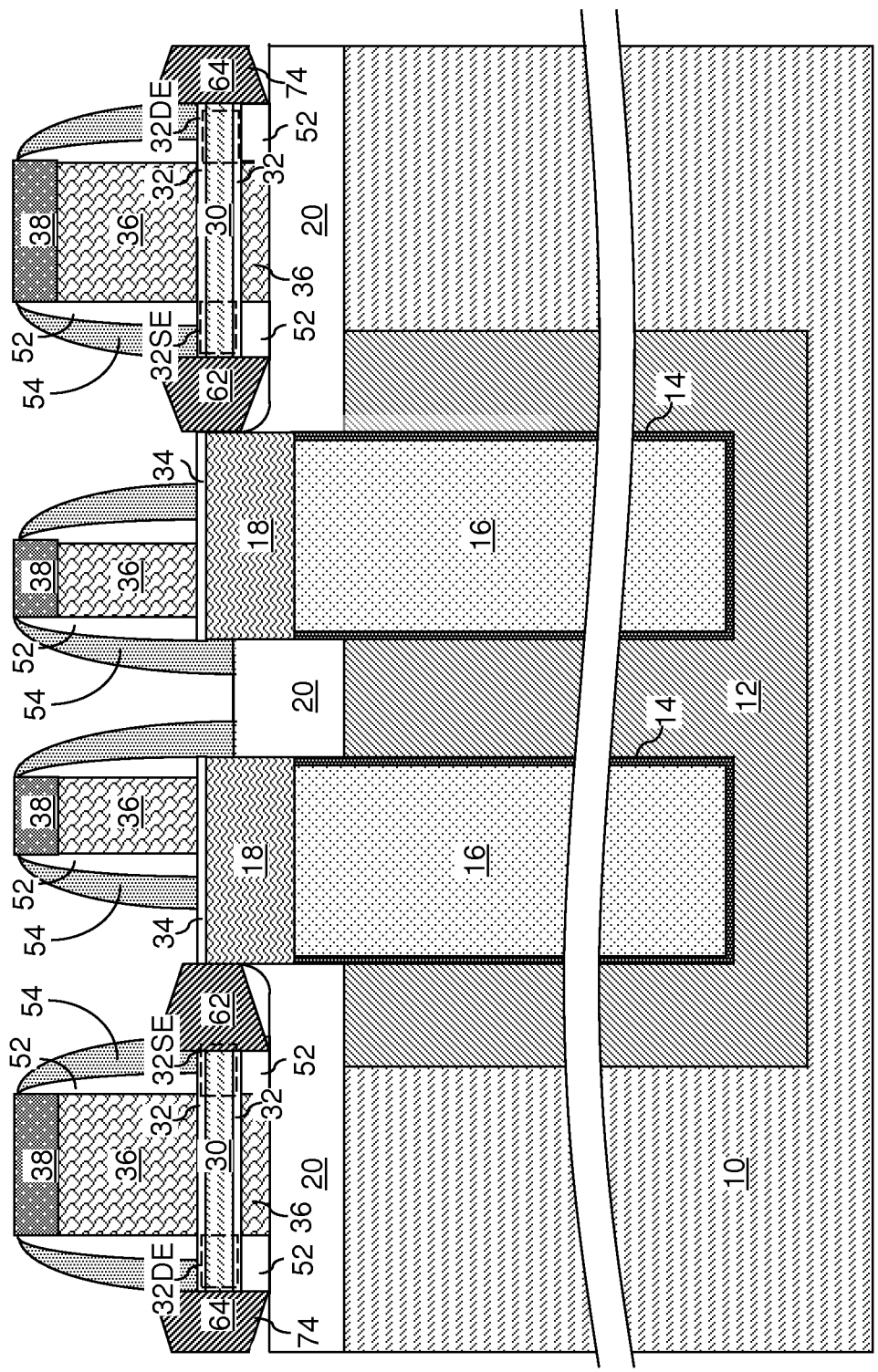
FIG. 11B is a vertical cross-sectional view of the exemplary semiconductor structure along the vertical plane B-B' of FIG. 11A.

Referring to FIGS. 11A and 11B, source regions 62 and drain regions 64 can be formed on first end surfaces 30E1 (See FIG. 10B) and on second end surfaces 30E2 (See FIG. 10B) of the semiconductor nanowires 30, respectively. The source regions 62 and the drain regions 64 can be formed, for example, can be formed by depositing a semiconductor material employing a selective epitaxy process. In one embodiment, the source regions 62 and the drain regions 64 can be formed as single crystalline semiconductor material portions that are in epitaxial alignment with a single crystalline semiconductor material within the semiconductor nanowires 30. In one embodiment, the source regions 62 and the drain regions 64 can be formed with in-situ doping of p-type dopants or n-type dopants. In another embodiment, the source regions 62 and the drain regions 64 can be formed as undoped semiconductor material portions, and electrical dopants can be subsequently introduced into the source regions 62 and the drain regions 64, for example, by ion implantation.

In one embodiment, the conductive material of the conductive cap structures 18 can be a metallic material from which selective deposition of a semiconductor material does not proceed. In this case, the selective deposition of the semiconductor material during the selective epitaxy proceeds only from the first end surfaces 30E1 and the second end surfaces 30E2 of the semiconductor nanowires 30.

Each source region 62 contacts one end of a semiconductor nanowire 30 at the first end surface 30E1 thereof. Each drain region 64 contacts another end of the semiconductor nanowire 30 at the second end surface 30E2 thereof. A vertical surface of each source region 62 contacts a vertical surface of the semiconductor nanowire 30, i.e., the first end surface 30E1, within the plane of the interface between the source region 62 and the semiconductor nanowire 30. A vertical surface of each drain region 64 contacts another vertical surface of the semiconductor nanowire 30, i.e., the second end surface 30E2, within the plane of the interface between the drain region 64 and the semiconductor nanowire 30.

Each source region 62 can grow from a first end surface 30E1 of a semiconductor nanowire 30 in all directions with, or without, crystallographic facets. Each source region 62 can contact a sidewall surface of the gate dielectric 32 that is within the same vertical plane as the first end surface 30E1. Thus, the vertical surface of each source region 62 contacting a first end surface 30E1 can have a greater area than the area of the first end surface 30E1. Likewise, each drain region 64 can grow from a second end surface 30E2 of a semiconductor nanowire 30 in all directions with, or without, crystallographic facets. Each drain region 64 can contact a sidewall surface of the gate dielectric 32 that is within the same vertical plane as the second end surface 30E2. Thus, the vertical surface of each drain region 64 contacting a second end surface 30E2 can have a greater area than the area of the second end surface 30E2.

Each source region 62 can extend below the bottommost surface of the semiconductor nanowire 30 that the source region 62 is in contact with. Further, each source region 62 can laterally extend farther than outermost lateral surfaces of the semiconductor nanowire 30 that the source region 62 is in contact with in a horizontal direction that is perpendicular to the lengthwise direction of the semiconductor nanowire 30, i.e., in the direction perpendicular to the B-B' plane. Each drain region 64 can extend below the bottommost surface of the semiconductor nanowire 30 that the drain region 64 is in contact with. Further, each drain region 64 can laterally extend farther than outermost lateral surfaces of the semiconductor nanowire 30 that the drain region 64 is in contact with in a horizontal direction that is perpendicular to the lengthwise direction of the semiconductor nanowire 30, i.e., in the direction perpendicular to the B-B' plane.

Figure 12A:
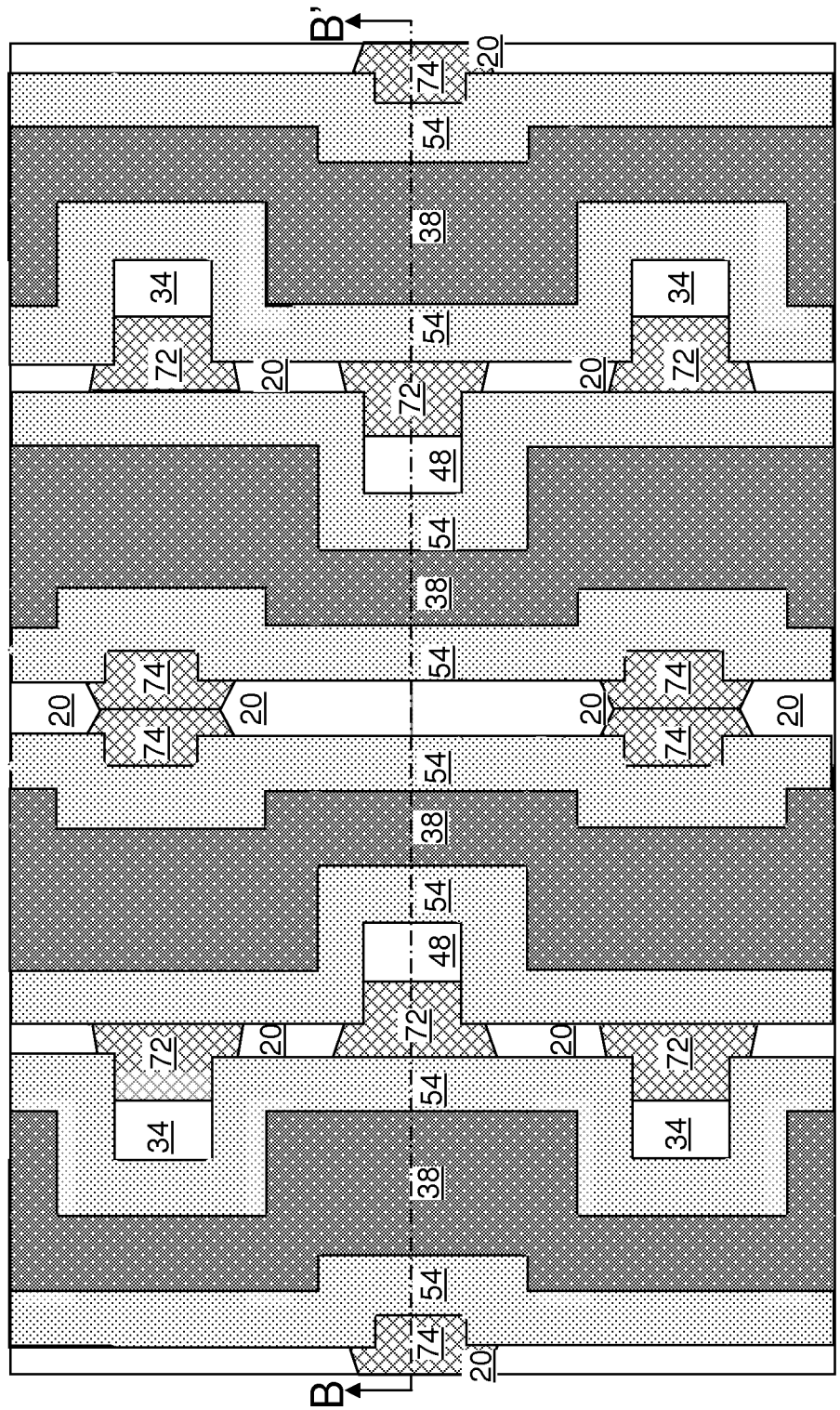
FIG. 12A is a top-down view of the exemplary semiconductor structure after formation of various metal semiconductor alloy portions according to an embodiment of the present disclosure.
Figure 12B:
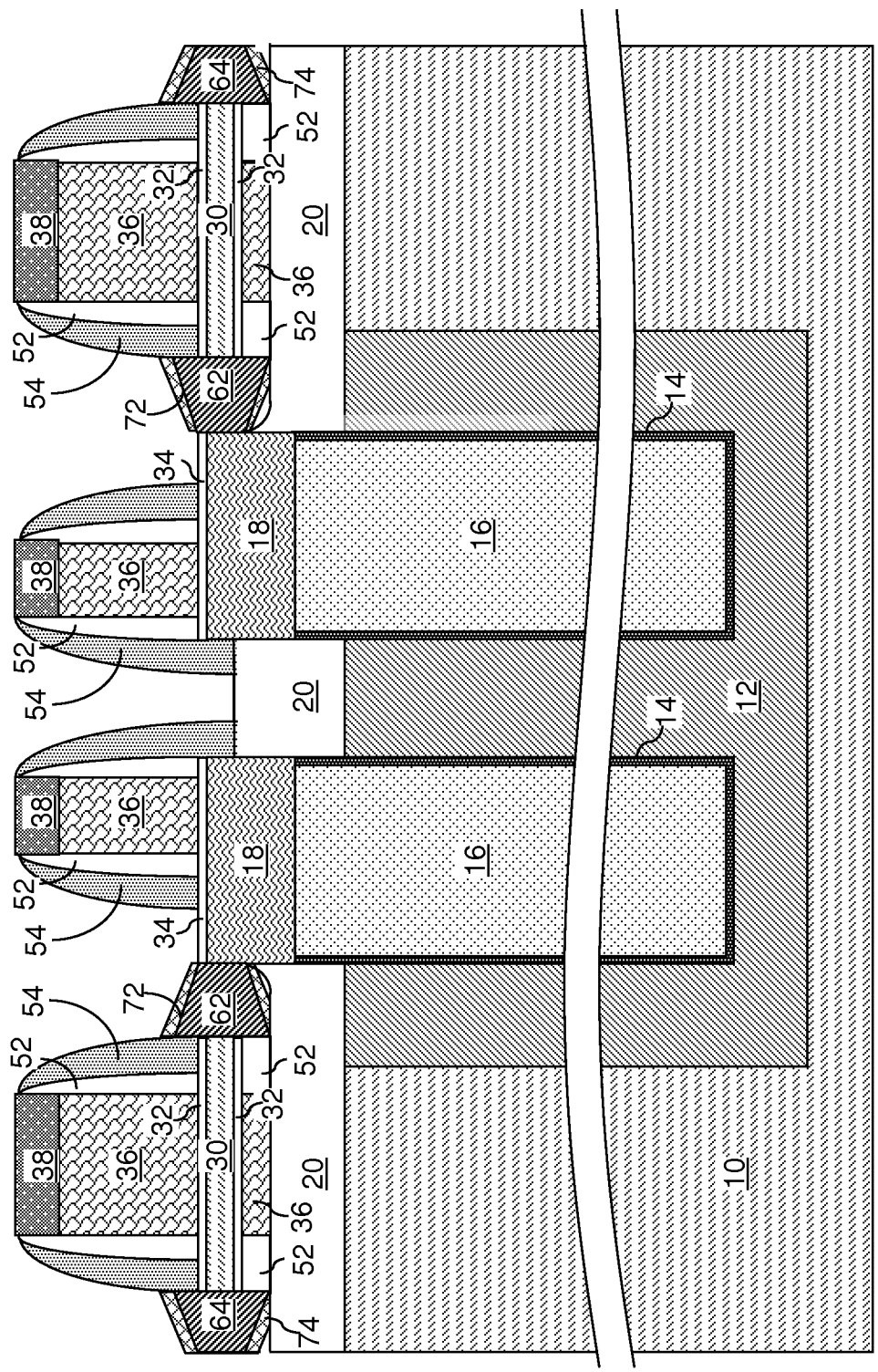
FIG. 12B is a vertical cross-sectional view of the exemplary semiconductor structure along the vertical plane B-B' of FIG. 12A.

Referring to FIGS. 12A and 12B, metal semiconductor alloy portions can be formed on the source regions 62 and the drain regions 64. For example, a source-side metal semiconductor alloy portion 72 can be formed on each source region 62, and a drain-side metal semiconductor alloy portion 74 can be formed on each drain region 64. The various metal semiconductor alloy portions (72, 74) can be formed, for example, by depositing a metal layer, and by reacting the metal within the metal layer with underlying semiconductor materials of the source regions 62 and the drain regions 64. Unreacted portions of the metal layer can be removed selective to the various metal semiconductor alloy portions (72, 74).

Each source-side metal semiconductor alloy portion 72 contacts a source region 62 and a conductive cap structure 18. Thus, an electrically conductive path is formed between the first end surface 30E1 (See FIG. 10B) of each semiconductor nanowire 30 and a conductive cap structure 18 through the combination of a source region 62 and the source-side metal semiconductor alloy portion 72.

Figure 13A:
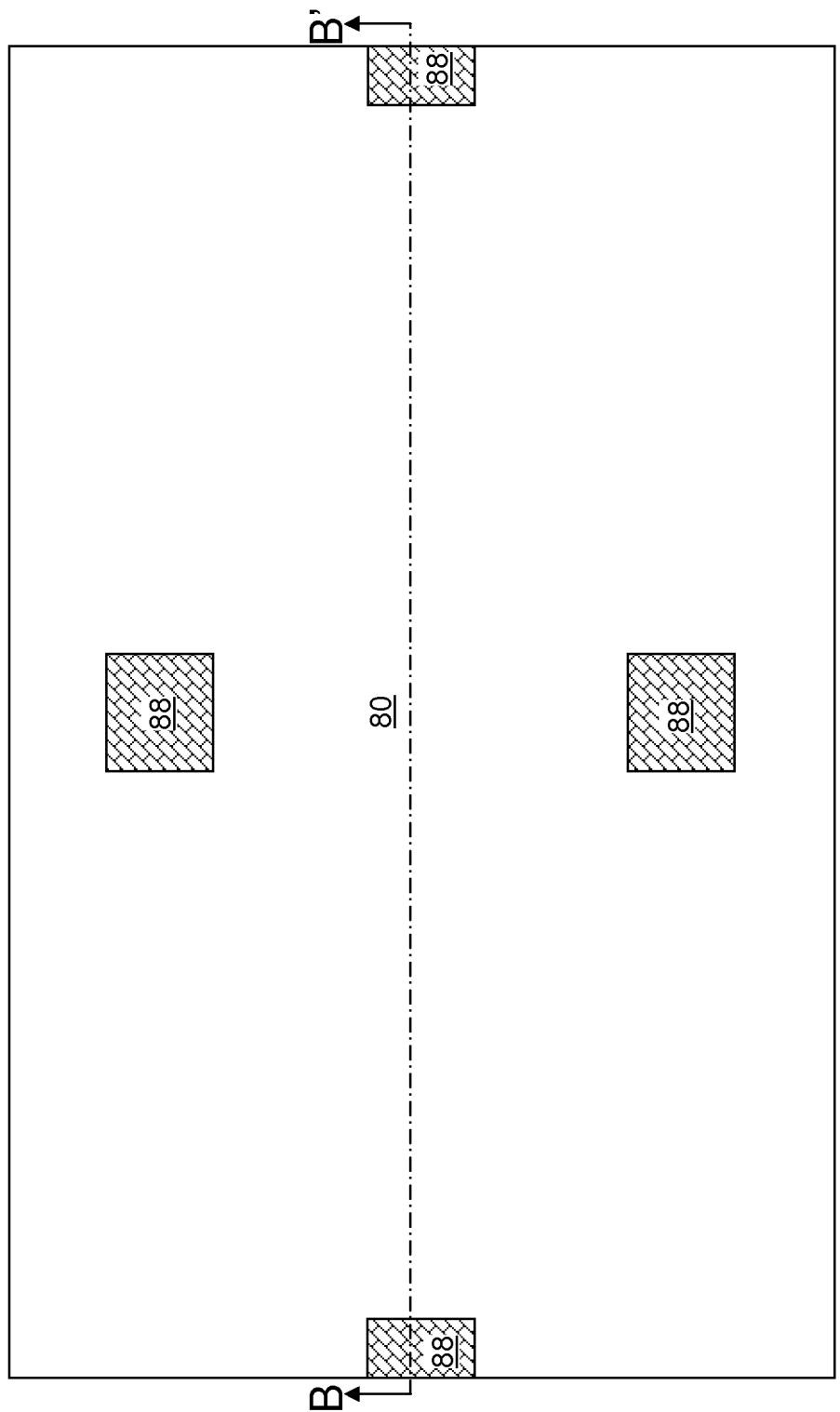
FIG. 13A is a top-down view of the exemplary semiconductor structure after formation of a contact level dielectric layer and various contact via structures according to an embodiment of the present disclosure.
Figure 13B:
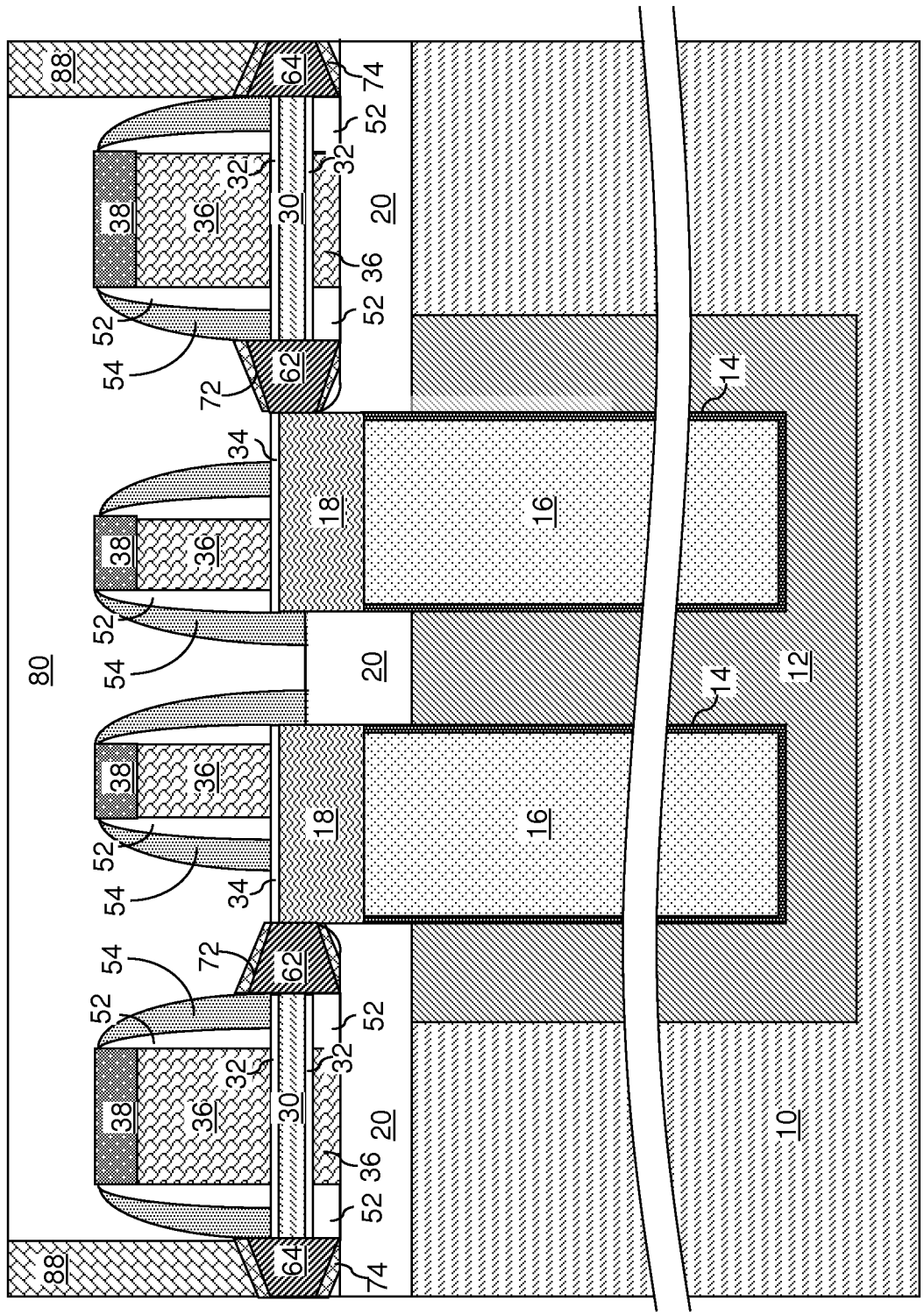
FIG. 13B is a vertical cross-sectional view of the exemplary semiconductor structure along the vertical plane B-B' of FIG. 13A.

Referring to FIGS. 13A and 13B, a contact level dielectric layer 80 including a dielectric material is deposited, for example, by chemical vapor deposition. The dielectric material of the contact level dielectric layer 80 can include, for example, silicon oxide, silicon nitride, porous or non-porous organosilicate glass, or combinations thereof. Optionally, the top surface of the contact level dielectric layer 80 can be planarized, for example, by chemical mechanical planarization (CMP).

Various contact via structures can be formed through the contact level dielectric layer 80 to provide electrical contact to various elements of the exemplary semiconductor structure. In one embodiment, the various contact via structures can include drain contact via structures 88, which contact two drain-side metal semiconductor alloy portions 74. Further, the various contact via structures can include gate contact via structures (not shown), which can contact the gate electrodes 36.

Each inner electrode 16 of a deep trench capacitor (12, 14, 16) is electrically connected to an access transistor. Specifically, each inner electrode 16 is connected to a source region 62 of a nanowire access transistor through a conductive cap structure 18 and a source-side metal semiconductor alloy portion 72. The nanowire access transistor includes the source region 62, a source extension region 32SE located within one end of the semiconductor nanowire 30 and contacting the source region 62, a drain extension region 32DE located within another end of the semiconductor nanowire 30, a body region located between the source extension region 32SE and the drain extension region 32DE, a gate dielectric 32, and a wraparound gate electrode portion of a gate electrode 36 that wraps around the body region around the lengthwise direction of the semiconductor nanowire 30.

Figure 14A:
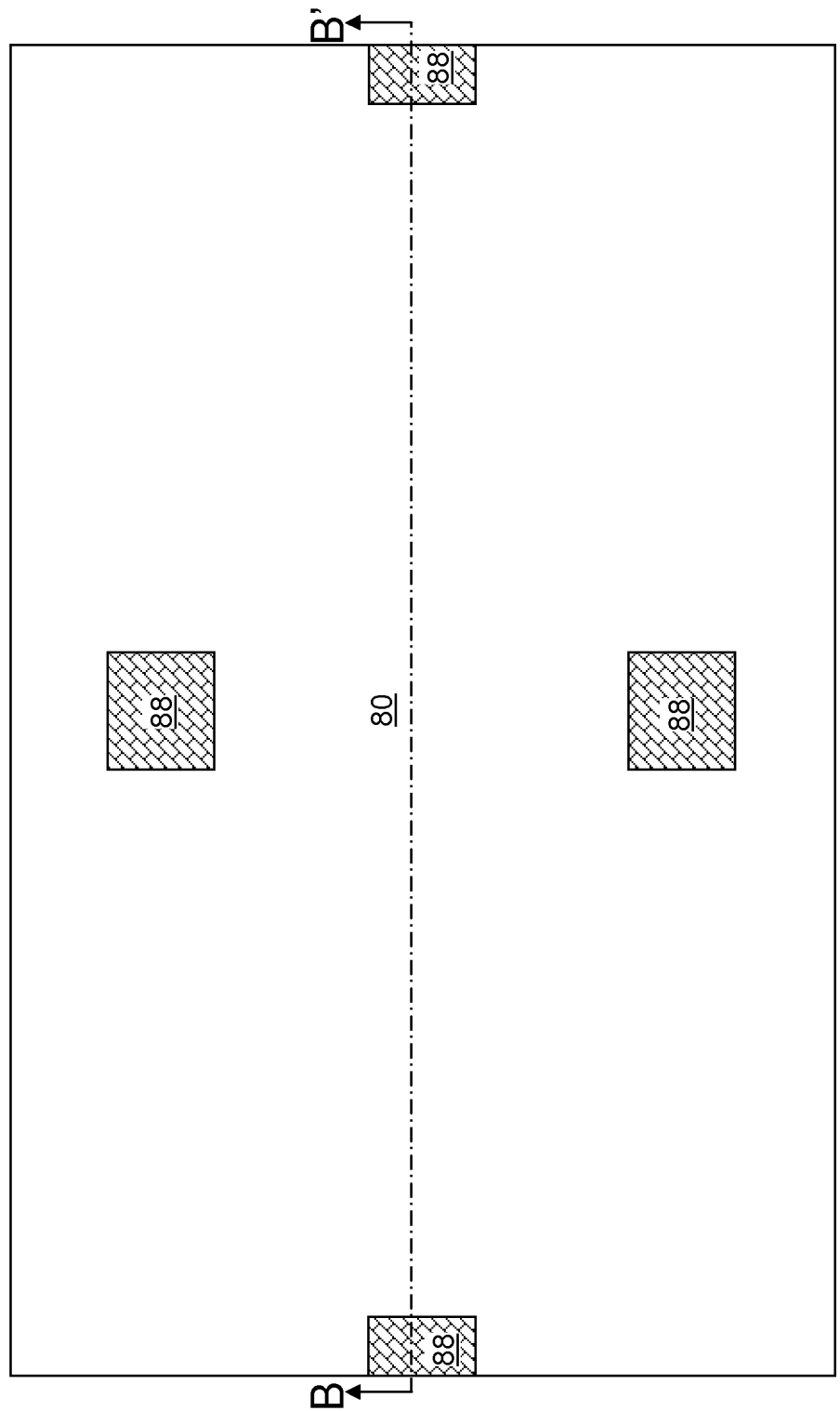
FIG. 14A is a top-down view of a variation of the exemplary semiconductor structure according to an embodiment of the present disclosure.
Figure 14B:
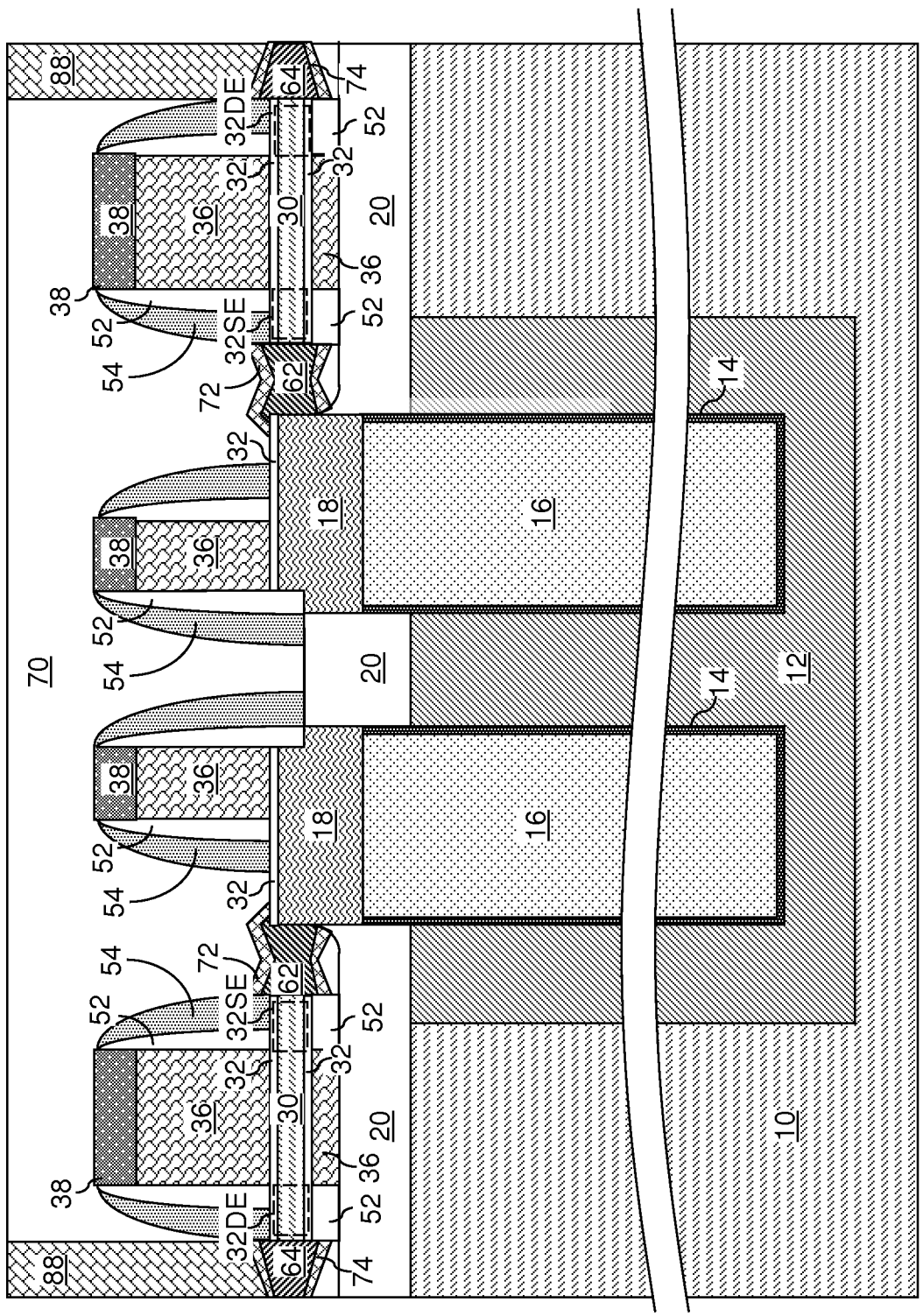
FIG. 14B is a vertical cross-sectional view of the variation of the exemplary semiconductor structure along the vertical plane B-B' of FIG. 14A.

Referring to FIGS. 14A and 14B, a variation of the exemplary semiconductor structure can be obtained if the material of the conductive cap structures 18 allows selective deposition of a semiconductor material therefrom. In this case, at the processing step of FIGS. 11A and 11B, semiconductor materials grow from the first end surfaces 30E1 and the physically exposed surfaces of the conductive cap structures 18 simultaneously during the selective deposition of the semiconductor material. In one embodiment, the conductive material of the conductive cap structures 18 can be a semiconductor material from which selective deposition of a semiconductor material proceeds. The two semiconductor material portions that grow from a first end surface 30E1 and a physically exposed surface of a conductive cap structure 18 merge to become a source region 62. Subsequently, the processing steps of FIGS. 12A, 12B, 13A, 13B, 14A, and 14B are sequentially performed to provide the variation of the exemplary semiconductor structure illustrated in FIGS. 14A and 14B.

While the disclosure has been described in terms of specific embodiments, it is evident in view of the foregoing description that numerous alternatives, modifications and variations will be apparent to those skilled in the art. Each of the embodiments described herein can be implemented individually or in combination with any other embodiment unless expressly stated otherwise or clearly incompatible. Accordingly, the disclosure is intended to encompass all such alternatives, modifications and variations which fall within the scope and spirit of the disclosure and the following claims.

What is claimed is:

1. A semiconductor structure comprising:
   a trench capacitor embedded in a substrate and comprising an inner electrode, a node dielectric, and an outer electrode;
   a conductive strap structure in contact with, and overlying, said inner electrode;
   a semiconductor nanowire overlying an insulator layer in said substrate;
   a source region contacting one end of said semiconductor nanowire; and
   a source-side metal semiconductor alloy portion contacting said source region, said source-side metal semiconductor alloy portion including a sub-portion that underlies said source region and physically contacts said conductive strap structure,
   wherein said semiconductor nanowire is vertically spaced from a planar top surface of said insulator layer, and a lengthwise direction of the semiconductor nanowire is parallel to said planar top surface of said insulator layer, and wherein said planar top surface of said insulator layer is adjoined to a curved top surface of said insulator layer that is adjoined to said conductive strap structure.

2. The semiconductor structure of claim 1, further comprising a wraparound gate electrode portion surrounding a center portion of said semiconductor nanowire and spaced from said semiconductor nanowire by a gate dielectric.

3. The semiconductor structure of claim 1, further comprising at least one gate spacer laterally contacting all sidewalls of said wraparound gate electrode portion.

4. The semiconductor structure of claim 3, wherein said at least one gate spacer contacts said planar top surface.

5. The semiconductor structure of claim 3, wherein end surfaces of said semiconductor nanowire that are perpendicular to a lengthwise direction of said semiconductor nanowire are vertically coincident with vertical portions of outer surfaces of said at least one gate spacer.

6. The semiconductor structure of claim 1, further comprising a source extension region located within one end of said semiconductor nanowire and contacting said source region.

7. The semiconductor structure of claim 1, wherein a vertical surface of said source region contacts a vertical surface of said semiconductor nanowire within a plane of an interface between said source region and said semiconductor nanowire, and said vertical surface of said source region has a greater area than said vertical surface of said semiconductor nanowire.

8. The semiconductor structure of claim 1, further comprising a drain region contacting an end surface of semiconductor nanowire.

9. The semiconductor structure of claim 1, wherein said source region extends below a bottommost surface of said semiconductor nanowire, and laterally extends farther than outermost lateral surfaces of said semiconductor nanowire in a horizontal direction that is perpendicular to a lengthwise direction of said semiconductor nanowire.

10. The semiconductor structure of claim 1, further comprising a passing gate electrode portion overlying said trench capacitor and electrically isolated from said trench capacitor.

11. The semiconductor structure of claim 10, further comprising at least one semiconductor material portion that underlies a portion of said passing gate electrode portion and laterally contacting said conductive strap structure.

12. The semiconductor structure of claim 11, wherein each of said at least one semiconductor material portion has a same composition and thickness as a body region within said semiconductor nanowire that is surrounded by said wraparound gate electrode portion.

13. The semiconductor structure of claim 1, wherein said source-side metal semiconductor alloy portion encircles said source region.

14. The semiconductor structure of claim 1, wherein said source-side metal semiconductor alloy portion contiguously extends from a sub-portion contacting a sidewall of said source region through another sub-portion contacting a bottom surface of said source region and to yet another sub-portion contacting another sidewall of said source region.

15. The semiconductor structure of claim 1, wherein a top portion of said source region extends above a horizontal plane including a topmost surface of said semiconductor nanowire.

16. The semiconductor structure of claim 1, wherein a bottom portion of said source region extends below a horizontal plane including a bottommost surface of said semiconductor nanowire.

17. A semiconductor structure comprising:
   a trench capacitor embedded in a substrate and comprising an inner electrode, a node dielectric, and an outer electrode;
   a conductive strap structure in contact with, and overlying, said inner electrode;
   a semiconductor nanowire overlying an insulator layer in said substrate;
   a source region contacting one end of said semiconductor nanowire;
   a source-side metal semiconductor alloy portion contacting said source region, said source-side metal semiconductor alloy portion including a sub-portion that underlies said source region and physically contacts said conductive strap structure;

a pair of semiconductor material portions having a same semiconductor material as, and a same thickness as, said semiconductor nanowire, and laterally contacting said conductive strap structure, wherein top surfaces of said pair of semiconductor material portions are coplanar with a top surface of said semiconductor nanowire, and bottom surfaces of said pair of semiconductor material portions are coplanar with a bottom surface of said semiconductor nanowire, and further wherein said planar top surface of said insulator layer is adjoined to a curved top surface of said insulator layer that is adjoined to said conductive strap structure.

18. The semiconductor structure of claim 17, wherein said semiconductor nanowire is vertically spaced from a planar top surface of said insulator layer, and a lengthwise direction of the semiconductor nanowire is parallel to said planar top surface of said insulator layer.

* * * * *